United States Patent
Lee et al.

(10) Patent No.: US 11,024,647 B2
(45) Date of Patent: Jun. 1, 2021

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Sang Yong Lee, Cheongju-si (KR); Sang Min Kim, Seoul (KR); Jung Ryul Ahn, Namyangju-si (KR); Sang Hyun Oh, Anyang-si (KR); Seung Bum Cha, Seoul (KR); Kang Sik Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/903,113

(22) Filed: Jun. 16, 2020

(65) Prior Publication Data

US 2020/0312879 A1    Oct. 1, 2020

Related U.S. Application Data

(63) Continuation of application No. 16/180,966, filed on Nov. 5, 2018, now Pat. No. 10,727,247.

(30) Foreign Application Priority Data

Mar. 8, 2018    (KR) ........................ 10-2018-0027463

(51) Int. Cl.
*H01L 27/11582*    (2017.01)
*H01L 25/065*    (2006.01)
(Continued)

(52) U.S. Cl.
CPC .... *H01L 27/11582* (2013.01); *H01L 25/0657* (2013.01); *H01L 27/0688* (2013.01); *H01L 27/11556* (2013.01)

(58) Field of Classification Search
CPC .......... H01L 27/11582; H01L 27/0688; H01L 27/11556; H01L 27/11519; H01L 27/11565; H01L 27/11563; H01L 27/11578; H01L 25/0657
USPC ....... 257/737, 773, 774, 777, 686, 324, 326, 257/E23.141, E23.151, E23.178, E25.013, 257/E25.023, E27.026, E27.081, E27.103,
(Continued)

(56) References Cited

U.S. PATENT DOCUMENTS 9,064,969 B2 * 6/2015 Konno ................. H01L 29/792
2013/0105883 A1 * 5/2013 Lee .................. H01L 27/11582
                                                                257/324
(Continued)

FOREIGN PATENT DOCUMENTS

KR    1020130006272 A    1/2013
KR    1020140137632 A    12/2014

*Primary Examiner* — Dao H Nguyen
(74) *Attorney, Agent, or Firm* — William Park & Associates Ltd.

(57) ABSTRACT

A semiconductor device includes: a first stack structure; a second stack structure adjacent to the first stack structure in a first direction; a first insulating layer including protrusion parts protruding in a second direction intersecting the first direction and including a concave part defined between the protrusion parts; and a second insulating layer located between the first stack structure and the second stack structure, the second insulating layer inserted into the concave part and the second insulating layer in contact with at least one protrusion part among the protrusion parts.

20 Claims, 18 Drawing Sheets

(51) Int. Cl.
*H01L 27/06* (2006.01)
*H01L 27/11556* (2017.01)

(58) Field of Classification Search
USPC .. 257/E27.112, E21.158, E21.409, E21.423, 257/E21.679; 438/109, 257, 268, 287, 438/478
See application file for complete search history.

(56) References Cited

U.S. PATENT DOCUMENTS

2015/0371993 A1* 12/2015 Jung ................. H01L 21/76877
257/773
2016/0260734 A1* 9/2016 Beppu ................. H01L 27/1157

\* cited by examiner

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 16/180,966, filed on Nov. 5, 2018, and claims priority under 35 U.S.C. § 119(a) to Korean patent application number 10-2018-0027463, filed on Mar. 8, 2018, which is incorporated herein by reference in its entirety.

BACKGROUND

1. Technical Field

Various embodiments of the present disclosure generally relate to an electronic device, and more particularly, to a semiconductor device and a manufacturing method of the semiconductor device.

2. Related Art

A nonvolatile memory device retains stored data even when the supply of power to the device is cut off. Recently, as the improvements in the degree of integration of two-dimensional nonvolatile memory devices in which memory cells are formed in a single layer on a substrate have reached an upper limit, three-dimensional nonvolatile memory devices are being proposed in which memory cells are vertically stacked in multiple layers on a substrate.

Typically, a three-dimensional nonvolatile memory device includes a plurality of interlayer insulating layers and gate electrodes, which are alternately stacked, and channel layers penetrating the interlayer insulating layers and the gate electrodes. Memory cells are stacked along the channel layers. Various structures and manufacturing methods have been developed for improving the operational reliability of the three-dimensional non-volatile memory device.

SUMMARY

According to an aspect of the present disclosure, there may be provided a semiconductor device including: a first stack structure; a second stack structure adjacent to the first stack structure in a first direction; a first insulating layer including protrusion parts protruding in a second direction intersecting the first direction and including a concave part defined between the protrusion parts; and a second insulating layer located between the first stack structure and the second stack structure, the second insulating layer inserted into the concave part and the second insulating layer in contact with at least one protrusion part among the protrusion parts.

According to another aspect of the present disclosure, there may be provided a semiconductor device including: a first stack structure including first conductive layers and first insulating layers, which are alternately stacked; a second stack structure adjacent to the first stack structure in a first direction, the second stack structure including second conductive layers and second insulating layers, which are alternately stacked; a first slit insulating structure including a first line pattern that extends in a second direction intersecting the first direction and penetrates the first stack structure and including a second line pattern that extends in the second direction and penetrates the second stack structure; a second slit insulating structure inserted between the first line pattern and the second line pattern, the second slit insulating structure being in contact with at least one of the first and second line patterns; and a dummy stack structure located between the first stack structure and the second stack structure, the dummy stack structure being isolated by the first slit insulating structure and the second slit insulating structure.

According to still another aspect of the present disclosure, there may be provided a semiconductor device including: a first stack structure; a second stack structure adjacent to the first stack structure in a first direction; a first slit insulating structure including a line pattern extending in the first direction and protrusion parts protruding in a second direction intersecting the first direction from the line pattern, the first slit insulating structure having a concave part defined between the protrusion parts; a second slit insulating structure located between the first stack structure and the second stack structure, the second slit insulating structure inserted into the concave part and the second slit insulating structure in contact with at least one protrusion part among the protrusion parts; and a dummy stack structure located in the concave part, the dummy stack structure being isolated by the first and second slit insulating structures.

According to still another aspect of the present disclosure, there may be provided a method of manufacturing a semiconductor device, the method including: forming a stack structure including first material layers and second material layers, which are alternately stacked; forming a first insulating layer penetrating the stack structure; forming a first opening that exposes the first insulating layer and penetrates the stack structure; replacing the first material layers with third material layers through the first opening; and forming a second insulating layer in the first opening, wherein one of the first insulating layer and the second insulating layer includes protrusion parts and a concave part defined between the protrusion parts, and the other of the first insulating layer and the second insulating layer is inserted into the concave part to be in contact with at least one protrusion part among the protrusion parts.

According to still another aspect of the present disclosure, there may be provided a method of manufacturing a semiconductor device, the method including: forming a stack structure including first material layers and second material layers, which are alternately stacked; forming a first slit insulating structure including first line patterns that penetrate the stack structure; forming a first opening that penetrates the stack structure and is inserted between adjacent first line patterns to expose at least one of the adjacent first line patterns; replacing the first material layers with third material layers through the first opening; and forming a second slit insulating structure in the first opening.

BRIEF DESCRIPTION OF THE DRAWINGS

Examples of embodiments will now be described hereinafter with reference to the accompanying drawings; however, they may be embodied in different forms and should not be construed as limited to the described embodiments set forth herein. Rather, these described embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one

DETAILED DESCRIPTION

Figure 1A:
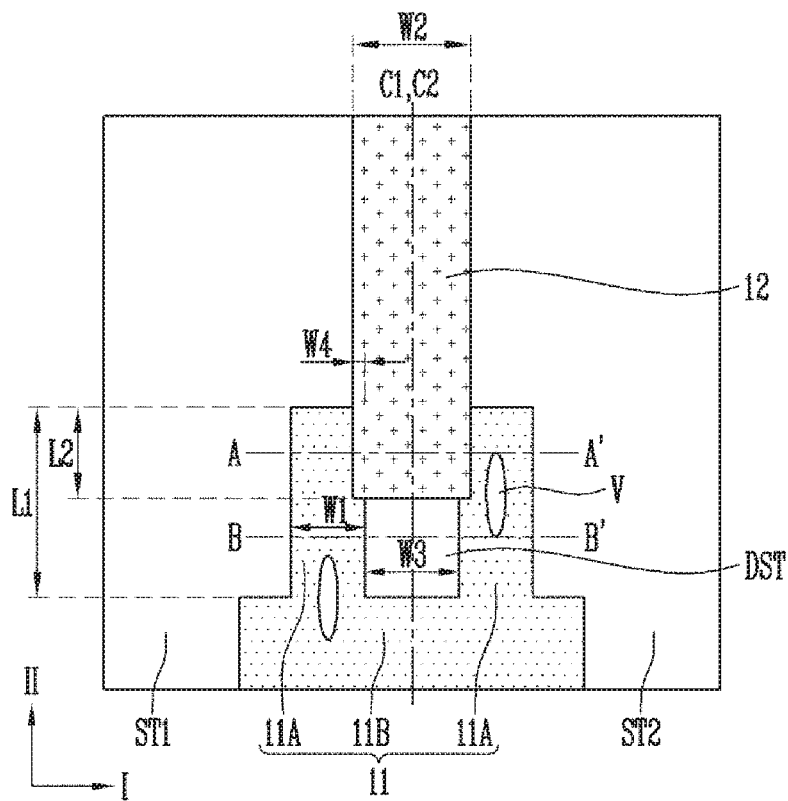
FIGS. 1A to 1D are views illustrating a structure of a semiconductor device according to an embodiment of the present disclosure.

Various embodiments of the present disclosure will be described with reference to the accompanying drawings. The examples of embodiments of the present disclosure may, however, be embodied in many different forms and should not be construed as limited to the examples of embodiments set forth herein. Rather, the examples of embodiments are provided so that disclosure of the present disclosure will be thorough and complete, and will fully convey the scope of the present disclosure to those skilled in the art. The features of examples of embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless clearly stated otherwise.

Various embodiments may provide a semiconductor device that facilitates a manufacturing process and may have a stable structure and improved characteristics, and a manufacturing method of the semiconductor device.

Figure 1B:
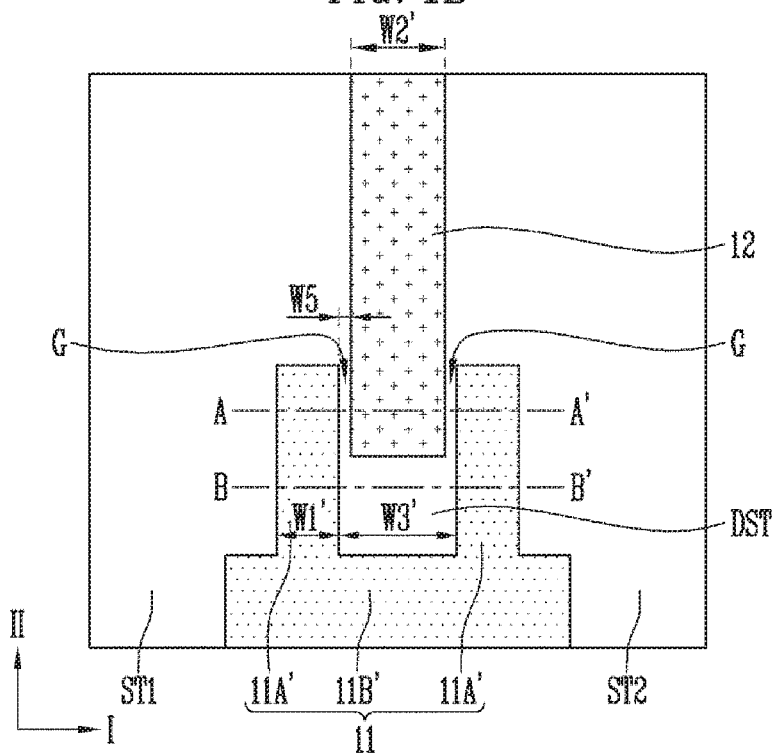
Figure 1C:
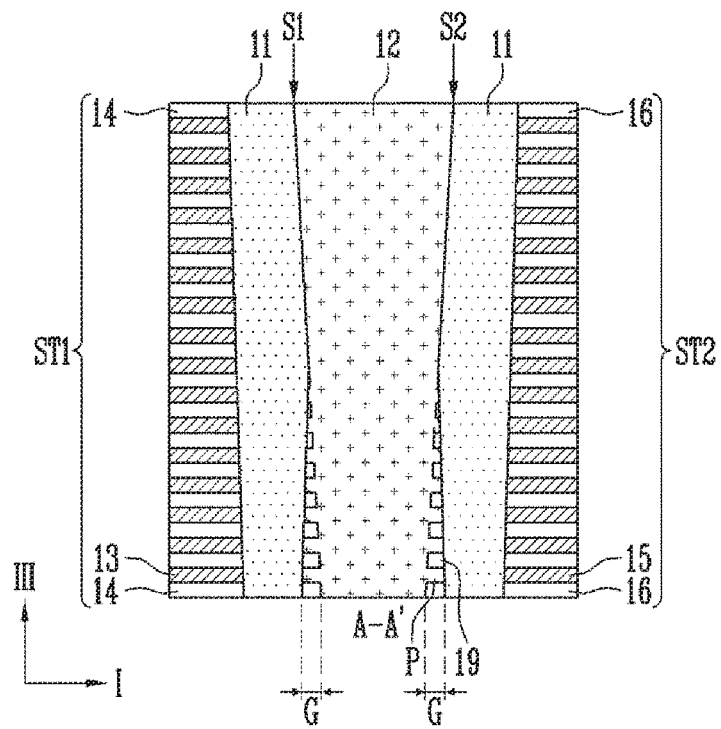
Figure 1D:
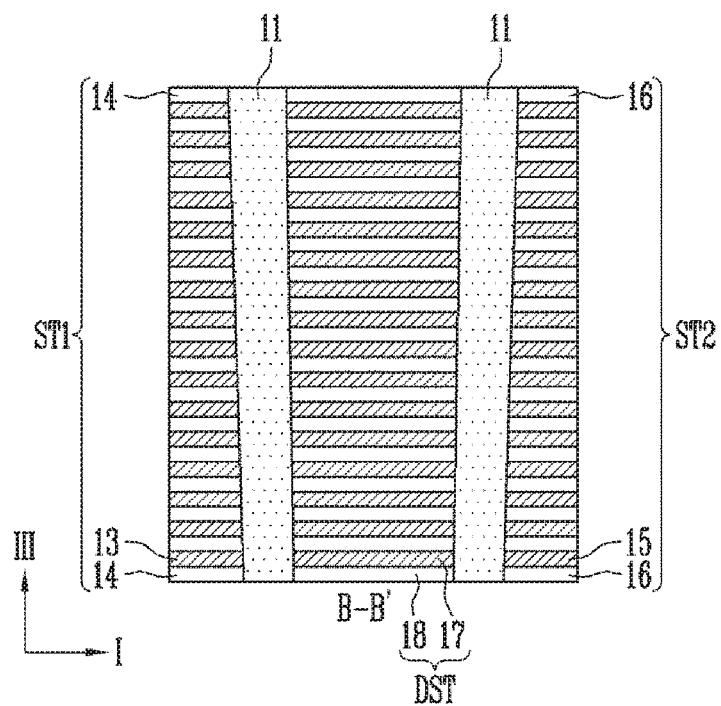

FIGS. 1A to 1D are views illustrating a structure of a semiconductor device according to an embodiment of the present disclosure. FIGS. 1A and 1B are layouts, FIG. 1C is a sectional view taken along line A-A' of FIGS. 1A and 1B, and FIG. 1D is a sectional view taken along line B-B' of FIGS. 1A and 1B.

Referring to FIG. 1A, the semiconductor device according to an embodiment of the present disclosure may include a first stack structure ST1, a second stack structure ST2, a first insulating layer 11, and a second insulating layer 12.

Each of the first stack structure ST1 and the second stack structure ST2 may have a structure in which a plurality of layers are stacked, and may have a gate structure including a gate electrode. Also, the first stack structure ST1 and the second stack structure ST2 may be located adjacent to each other in a first direction I.

The first insulating layer 11 and the second insulating layer 12 may have an insulating structure in which they are connected to each other, and may have a slit insulating structure. The first insulating layer 11 and the second insulating layer 12 may be located between the first stack structure ST1 and the second stack structure ST2, and separate the first stack structure ST1 and the second stack structure ST2 from each other. The first insulating layer 11 and the second insulating layer 12 may be layers that include an insulating material such as an oxide layer and are formed through separate processes. For example, the second insulating layer 12 may be formed after the first insulating layer 11 is formed, or the first insulating layer 11 may be formed after the second insulating layer 12 is formed. Therefore, an interface may exist between the first insulating layer 11 and the second insulating layer 12.

The first insulating layer 11 may include a plurality of protrusion parts 11A protruding in a second direction II intersecting the first direction I and at least one concave part defined between the plurality of protrusion parts 11A. For example, the first insulating layer 11 may include a line pattern 11B extending in the first direction I and the protrusion parts 11A protruding in the second direction II from the line pattern 11B.

The first insulating layer 11 may include a void V therein. The void V is an empty space in which the insulating material is not filled, and one first insulating layer 11 may include at least one void V. The void V may be located in the protrusion part 11A, be located in the line pattern 11B, or be located throughout the protrusion part 11A and the line pattern 11B.

The second insulating layer 12 may be inserted into the at least one concave part of the first insulating layer 11, and be in contact with at least one of the protrusion parts 11A. The second insulating layer 12 may be a line pattern extending in the second direction II, and be located at a boundary between the first stack structure ST1 and the second stack structure ST2.

The second insulating layer 12 may be in contact with at least one of the protrusion parts 11A. A center C2 of the second insulating layer 12 and a center C1 of the concave part may correspond to each other, or be offset in the first direction I. In addition, the second insulating layer 12 may have a width wider than that of the concave part (W2>W3). Therefore, the second insulating layer 12 may be in contact with the protrusion parts 11A, or be in contact with the protrusion part 11A at one side thereof, according to the position of the center C2 of the second insulating layer 12, the width of the second insulating layer 12, or the like.

FIG. 1A illustrates an embodiment in which the center C1 and the center C2 substantially correspond to each other, and the second insulating layer 12 has a width wider than that of the concave part (W2>W3) and is in contact with the protrusion parts 11A at both sides of the second insulating layer 12. The protrusion parts 11A and the second insulating layer 12 may overlap with each other with a predetermined width W4 in the first direction I. Therefore, it may be required to adjust the width W4 such that the second insulating layer 12 is not in contact with the void V in the first insulating layer 11. For example, a width W1 of the protrusion parts 11A may be determined by considering the value X of a width with which the protrusion part 11A and the second insulating layer 12 overlap with each other in a layout of a design phase and the value Y of a width with which the protrusion part 11A and the second insulating layer 12 overlap with each other according to a variation in an actual process. Therefore, the width W1 of the protrusion parts 11A may be determined to satisfy a condition (W1≥(X+Y)*2).

In addition, the second insulating layer 12 may be located to fill in only a portion of the concave part. In other words, a length L2 with which the second insulating layer 12 and the protrusion parts 11A overlap with each other may be shorter than a length L1 of the protrusion parts 11A in the second direction II. A gap exists between the second insulating layer 12 and the line pattern 11B. Thus, the second insulating layer 12 can be prevented from being in contact with the void V even when the void V exists in the line pattern 11B. When a layout is designed such that the length L2 is short, the first insulating layer 11 and the second insulating layer 12 might not be connected to each other due to the variation in the actual process. When this fact is considered, the overlapping ratio (L1/L2) of the protrusion parts 11A and the second insulating layer 12 may be 20% or more.

Referring to FIGS. 1A and 1C, the first stack structure ST1, the second stack structure ST2, the first insulating layer 11, and the second insulating layer 12 may have structures having a high aspect ratio. The first stack structure ST1 may include first conductive layers 13 and first insulating layers 14, which are alternately stacked, and the second stack structure ST2 may include second conductive layers 15 and second insulating layers 16, which are alternately stacked. The first and second conductive layers 13 and 15 may be gate electrodes of select transistors, memory cells, and the like, and include a conductive material such as polysilicon or tungsten.

The first insulating layer 11 and the second insulating layer 12 may penetrate at least one of the first stack structure ST1 and the second stack structure ST2. For example, the first and second insulating layers 11 and 12 may penetrate at least one of the first stack structure ST1 and the second stack structure ST2 in a third direction III intersecting the first direction I and the second direction II. The third direction III may be a stacking direction.

In addition, the concave part of the first insulating layer 11 may be located at the boundary between the first stack structure ST1 and the second stack structure ST2, the protrusion part 11A located at one side S1 of the second insulating layer 12 may penetrate the first stack structure ST1, and the protrusion part 11A located at the other side S2 of the second insulating layer 12 may penetrate the second stack structure ST2. The second insulating layer 12 may be located at the boundary between the first stack structure ST1 and the second stack structure ST2, and may be connected to the first insulating layer 11.

Therefore, the first stack structure ST1 and the second stack structure ST2 may be separated from each other by the first and second insulating layers 11 and 12. For example, first and second conductive layers 13 and 15 located at the same level among the first conductive layers 13 of the first stack structure ST1 and the second conductive layers 15 of the second stack structure ST2 may be electrically separated from each other by the first and second insulating layers 11 and 12.

Referring to FIGS. 1A and 1D, a dummy stack structure DST may be located in the concave part of the first insulating layer 11. For example, the dummy stack structure DST may be located to fill in the gap between the second insulating layer 12 and the line pattern 11B.

The dummy stack structure DST may include third conductive layers 17 and third insulating layers 18, which are alternately stacked. The third conductive layers 17 may be located at levels corresponding to the first and second conductive layers 13 and 15. In addition, the third conductive layers 17 may include the same material as the first and second conductive layers 13 and 15, and may include a conductive material such as polysilicon or tungsten.

The dummy stack structure DST may be isolated by the first and second insulating layers 11 and 12. Therefore, first and third conductive layers 13 and 17 located at the same level may be electrically separated from each other by the first and second insulating layers 11 and 12. In addition, the second and third conductive layers 15 and 17 located at the same level may be electrically separated from each other by the first and second insulating layers 11 and 12.

Meanwhile, when the first and second insulating layers 11 and 12 have structures having a high aspect ratio, their widths may decrease when approaching their bottoms. For example, the first and second insulating layers 11 and 12 may have inclined sidewalk, and their areas may decrease when approaching their bottoms. Therefore, the first and second insulating layers 11 and 12 may have different layouts depending on levels. FIG. 1A illustrates layouts of the first and second insulating layers 11 and 12 at a relatively high level, and FIG. 1B illustrates layouts of the first and second insulating layers 11 and 12 at a relatively low level. Hereinafter, for convenience of description, it is assumed that the layout of FIG. 1A represents an upper portion of the first insulating layer 11 and the layout of FIG. 1B represents a lower portion of the first insulating layer 11.

Referring to FIGS. 1A and 1B, the lower portion of the first insulating layer 11 may include a lower concave part defined between lower protrusion parts 11A'. Also, the first insulating layer 11 may include a lower line pattern 11B' connecting the lower protrusion parts 11A' to each other.

The lower protrusion parts 11A' may have a first width W1' with a value smaller than that of the upper protrusion part 11A (W1'<W1). The lower concave part may have a third width W3' with a value larger than that of the upper concave part (W3'>W3). For example, an upper surface of the second insulating layer 12 may have a width wider than that of the upper concave part (W2>W3), and a lower surface of the second insulating layer 12 may have a width narrower than that of the lower concave part (W2'<W3').

According to the above-described structure, while the first insulating layer 11 and the second insulating layer 12 are in direct contact with each other in the first direction I at a relatively high level (FIG. 1A), the first insulating layer 11 and the second insulating layer 12 may be spaced apart from each other in the first direction I at a relatively low level (FIG. 1B). That is, a gap G having a predetermined width W5 may exist between lower sidewalls of the first and second insulating layers 11 and 12. The first to third conductive layers 13, 15, and 17 may be connected to each other through the gap G. That is, the first stack structure ST1 and the second stack structure ST2 may be electrically connected to each other through the dummy stack structure DST.

Accordingly, an additional structure may be required to prevent the first to third conductive layers 13, 15, and 17 from being connected to each other through the gap G.

To this end, in an embodiment of the present disclosure, protrusion patterns P may be formed at a sidewall of the second insulating layer 12. Referring to FIG. 1C, a gap G may exist between sidewalls of the first and second insulating layers 11 and 12, and protrusion patterns P protruding from the sidewall of the second insulating layer 12 may be located in the gap G. The protrusion patterns P may be located at a height corresponding to the first to third conductive layers 13, 15, and 17. Also, the protrusion patterns P may protrude toward the first insulating layer 11 at both sides of the second insulating layer 12, and may be in direct contact with the first insulating layer 11. Thus, the first conductive layers 13 and the third conductive layers 17 can be separated from each other by the protrusion patterns P, and the second conductive layers 15 and the third conductive layers 17 can be separated from each other by the protrusion patterns P. That is, although a clearance exists between lower portions of the first and second insulating layers 11 and 12, the first stack structure ST1 and the second stack structure ST2 can be electrically separated from each other.

Insulating patterns 19 may be interposed between the stacked protrusion patterns P. Therefore, the gap G may be filled with the protrusion patterns P and the insulating patterns 19, which are alternately stacked. The insulating patterns 19 may include an insulating material such as an oxide layer. Also, the insulating patterns 19 may be located at levels corresponding to the first insulating layers 14 and the second insulating layers 16, and the first and second insulating layers 14 and 16 and the insulating patterns 19 at the same level may constitute one layer in which they are connected to each other.

In addition, when a gap G existing at the one side S1 of the second insulating layer 12 and a gap G existing at the other side S2 of the second insulating layer 12 have the substantially same width, the protrusion patterns P may be formed in a symmetrical structure at both the sides of the second insulating layer 12. For example, when the center C1 of the concave part and the center C2 of the second insulating layer 12 correspond to each other, the gaps G at both the sides of the second insulating layer 12 may have the substantially same width. In addition, the same number of protrusion patterns P may be formed at both the sides of the second insulating layer 12, or the protrusion patterns P formed at both the sides of the second insulating layer 12 may have the substantially same width. Therefore, the protrusion patterns P may be formed in a symmetrical structure at both sidewalls of the second insulating layer 12.

Meanwhile, although a case where the second insulating layer 12 fills in only a portion of the concave part is illustrated in FIG. 1A, the second insulating layer 12 may completely fill in the concave part. That is, the overlapping ratio (L1/L2) of the protrusion parts 11A and the second insulating layer 12 may be 100% or more.

When the overlapping ratio (L1/L2) is 100% or more, it will be likely that the second insulating layer 12 will be in contact with the void V in the line pattern 11B. Thus, the overlapping ratio (L1/L2) may be designed by considering a height at which the void V is formed and width decreasing rates corresponding to levels of the first and second insulating layers 11 and 12. Accordingly, the overlapping ratio (L1/L2) can be increased within a limit where the second insulating layer 12 and the void V are not in contact with each other.

When the first and second insulating layers 11 and 12 have structures having a high aspect ratio, their widths may decrease when approaching their bottoms. In addition, when the first insulating layer 11 is formed by depositing an insulating material in a trench, the void V may exist at a position lowered to a predetermined level from an upper surface of the first insulating layer 11, Thus, although the overlapping ratio (L1/L2) is 100% or more at upper portions of the first and second insulating layers 11 and 12, the first and second insulating layers 11 and 12 can be spaced apart from each other in the second direction II at the predetermined level or less. That is, the first and second insulating layers 11 and 12 can be spaced apart from each other at a level corresponding to the void V. Accordingly, although the second insulating layer 12 completely fills in the concave part, the second insulating layer 12 and the void V can be prevented from being in contact with each other. When considering this fact, the overlapping ratio (L1/L2) of the protrusion parts 11A and the second insulating layer 12 may be 120% or less.

According to the above-described structure, the first insulating layer 11 and the second insulating layer 12 may be connected to each other in a form in which the second insulating layer 12 is inserted into the concave part of the first insulating layer 11, so that the first stack structure ST1 and the second stack structure ST2 can be easily separated from each other. In particular, the area in which the first insulating layer 11 and the second insulating layer 12 overlap with each other can be decreased as compared with when the first insulating layer 11 and the second insulating layer 12 are connected to each other in a cross form in which they completely cross each other.

In addition, although the first and second insulating layers 11 and 12 have structures having a high aspect ratio such that the gap having the predetermined width W5 exists between the first and second insulating layers 11 and 12 at a relatively low level, the first stack structure ST1 and the second stack structure ST2 can be electrically separated from each other by the protrusion patterns P.

Figure 2A:
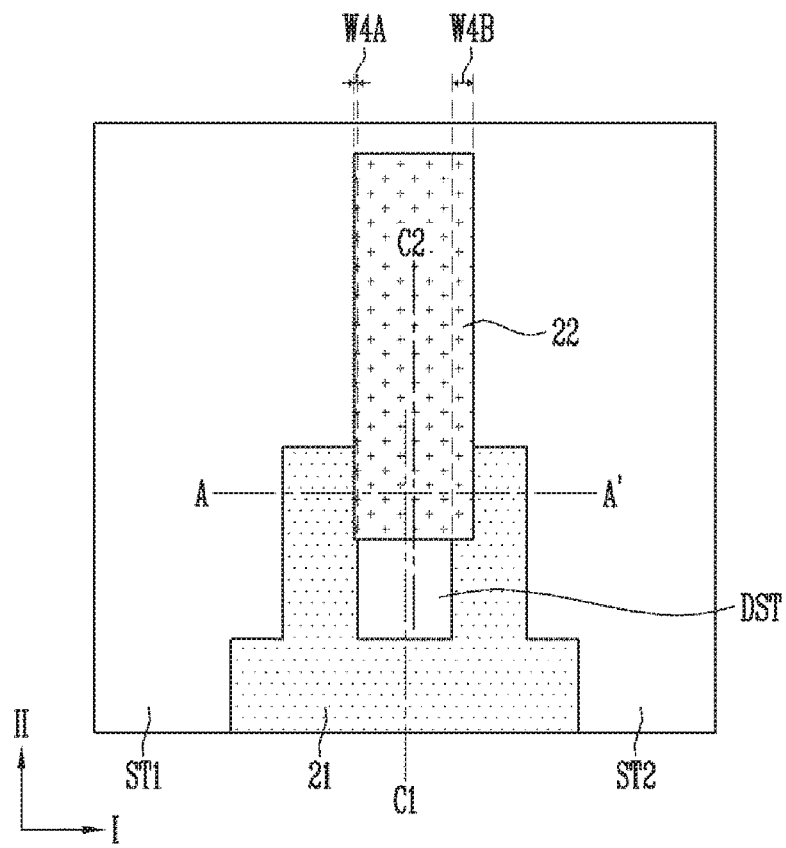
FIGS. 2A to 2C are views illustrating a structure of a semiconductor device according to an embodiment of the present disclosure.
Figure 2B:
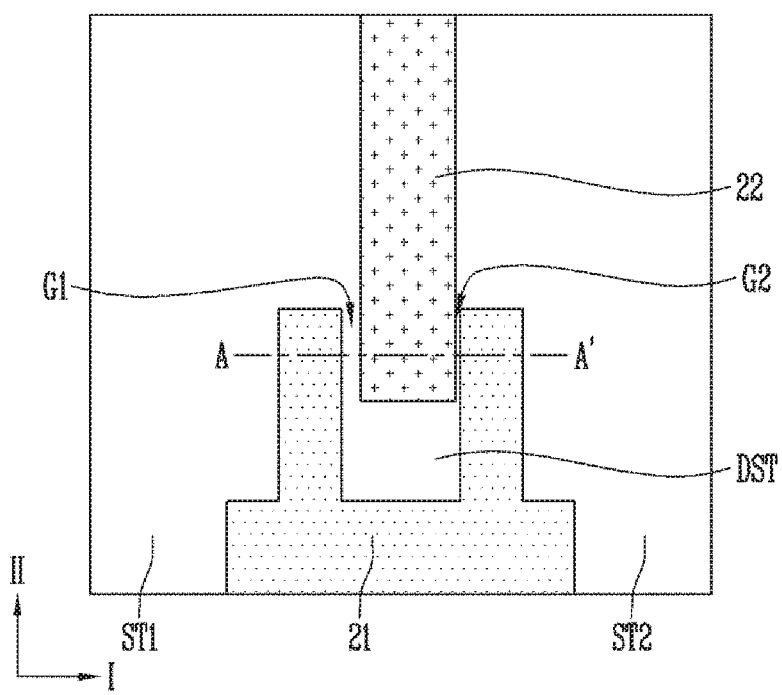
Figure 2C:
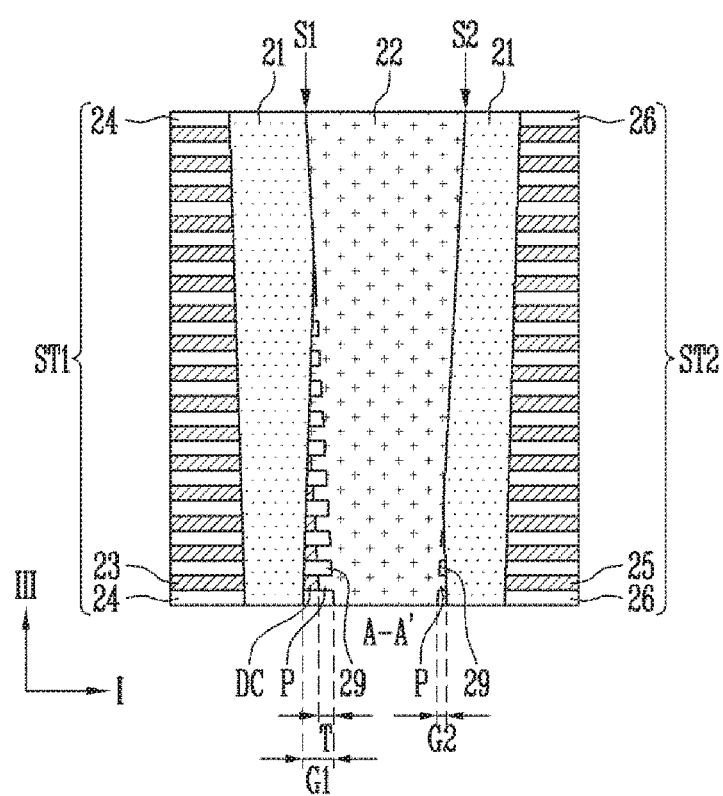

FIGS. 2A to 2C are views illustrating a structure of a semiconductor device according to an embodiment of the present disclosure. FIG. 2A is an upper layout of first and second insulating layers 21 and 22, FIG. 2B is a lower layout of the first and second insulating layers 21 and 22, and FIG. 2C is a sectional view taken along line A-A' of FIGS. 2A and 2B. Hereinafter, descriptions of contents overlapping with those of the above-described embodiment will be omitted.

Referring to FIGS. 2A to 2C, the semiconductor device according to an embodiment of the present disclosure may include a first stack structure ST1, a second stack structure ST2, a first insulating layer 21, and a second insulating layer 22. The first stack structure ST1 may include first conductive layers 23 and third insulating layers 24, which are alternately stacked, and the second stack structure ST2 may include second conductive layers 25 and fourth insulating layers 26, which are alternately stacked. In addition, a dummy stack structure DST may be located in a concave part of the first insulating layer 21. The dummy stack structure DST may include third conductive layers and fifth insulating layers, which are alternately stacked.

According to an embodiment, a center C2 of the second insulating layer 22 may be located offset in a first direction I from a center C1 of the first insulating layer 21. Therefore, an overlapping width W4A at one side S1 of the second insulating layer 22 and an overlapping width W4B at the other side S2 of the second insulating layer 22 may have different values. The overlapping widths W4A and W4B may have influence on the number and width of protrusion patterns P. For example, when the overlapping width W4B is widened, a gap G2 between the first insulating layer 21 and the second insulating layer 22 may be narrowed, and hence the number and width of protrusion patterns P may be decreased. In addition, when the overlapping width W4A is narrowed, a gap G1 between the first insulating layer 21 and the second insulating layer 22 may be widened, and hence the number and width of protrusion patterns P may be increased. Therefore, the second insulating layer 22 may include protrusion patterns P asymmetrically arranged at both the sides S1 and S2 thereof.

Meanwhile, when the overlapping width W4A is narrowed, the gap G1 between the first insulating layer 21 and the second insulating layer 22 may be widened, but the maximum width T of the protrusion patterns P may be limited. Therefore, when the gap G1 is wider than the maximum width T of the protrusion patterns P, dummy conductive patterns DC may be interposed between the first insulating layer 21 and the protrusion patterns P. The dummy conductive patterns DC may be located at the same level as the first conductive layers 23, the second conductive layers 25, and the protrusion patterns P.

The dummy conductive patterns DC may include a conductive material, and may be formed of the same material as the first and second conductive layers 23 and 25. Therefore, the first conductive layers 23 and the third conductive layers (see "17" of FIG. 1D) of the dummy stack structure DST may be connected to each other by the dummy conductive patterns DC at the one side S1 of the second insulating layer 22. However, since the dummy conductive pattern DC might not exist at the other side S2 of the second insulating layer 22, the second conductive layers 25 and the third conductive layers (see "17" of FIG. 1D) of the dummy stack structure DST may be insulated from each other. Accordingly, the first conductive layers 23 and the second conductive layers 25 can be electrically separated from each other.

In an embodiment, insulating patterns 29 may be interposed between the stacked protrusion patterns P. The insulating patterns 29 may include an insulating material such as an oxide layer. Also, the insulating patterns 29 may be located at levels corresponding to the third insulating layers 24 and the fourth insulating layers 26.

FIGS. 3A to 3D are layouts illustrating a structure of a semiconductor device according to an embodiment of the present disclosure. Hereinafter, descriptions of contents overlapping with those of the above-described embodiment will be omitted.

Referring to FIGS. 3A to 3D, a first stack structure ST1 and a second stack structure ST2 may be separated from each other by first and second insulating layers 31 to 61 and 32 to 62 connected to each other, and a dummy stack structure DST may be isolated by the first and second insulating layers 31 to 61 and 32 to 62. The first insulating layers 31 to 61 may have a first slit insulating structure, and the second insulating layers 32 to 62 may have a second slit insulating structure.

Figure 3A:
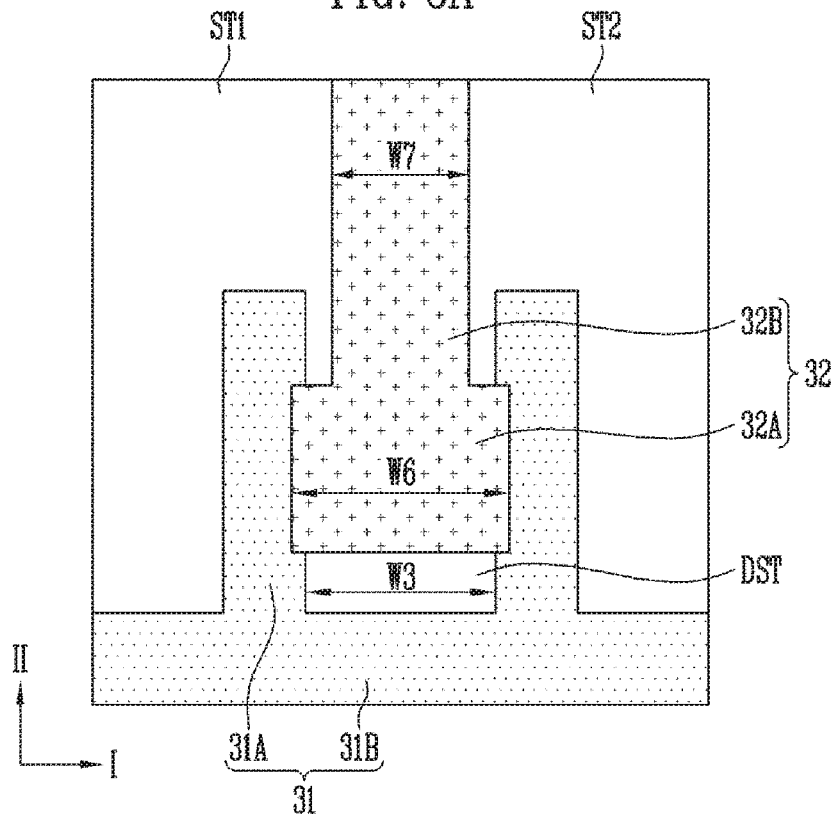
FIGS. 3A to 3D are views illustrating a structure of a semiconductor device according to an embodiment of the present disclosure.

Referring to FIG. 3A, the first insulating layer 31 may include a line pattern 31B extending in a first direction I and protrusion parts 31A extending in a second direction II intersecting the first direction I from the line pattern 31B. A concave part may be defined between the adjacent protrusion parts 31A. The concave part may be located at a boundary between the adjacent first and second stack structures ST1 and ST2.

The second insulating layer 32 may be a line pattern extending in the second direction II, and be located at the boundary between the adjacent first and second stack structures ST1 and ST2. The second insulating layer 32 may have different widths depending on regions. For example, an end 32A of the second insulating layer 32 may have a width wider than that of a remaining region 32B (W6>W7). Therefore, the end 32A may be in direct contact with the protrusion parts 31A at both sides of the first insulating layer 31. That is, the first region 32A of the second insulating layer 32, which overlaps with the protrusion parts 31A, may have a width wider than that of the second region 32B that does not overlap with the protrusion parts 31A. As described above, the width of the end 32A may be increased, so that the first insulating layer 31 and the second insulating layer 32 can be more easily connected to each other.

In addition, the remaining region 32B may have a width narrower than that of the concave part (W7<W3). Therefore, only the end 32A may be directly connected to the protrusion parts 31A, and the remaining region 32B might not be directly connected to the protrusion parts 31A. Thus, the overlapping area of the first insulating layer 31 and the second insulating layer 32 can be decreased. That is, the first insulating layer 31 and the second insulating layer 32 can be connected to each other while minimizing the overlapping area of the first insulating layer 31 and the second insulating layer 32.

Meanwhile, the first and second insulating layers 31 and 32 may have structures having a high aspect ratio, and their areas may decrease when approaching their bottoms. Therefore, lower portions of the first and second insulating layers 31 and 32 may not be connected to each other. However, as described with reference to FIGS. 1C and 2B, protrusion patterns may be formed at a lower sidewall of the first insulating layer 31, and hence the first stack structure ST1 and the second stack structure ST2 can be separated from each other by the protrusion patterns.

Figure 3B:
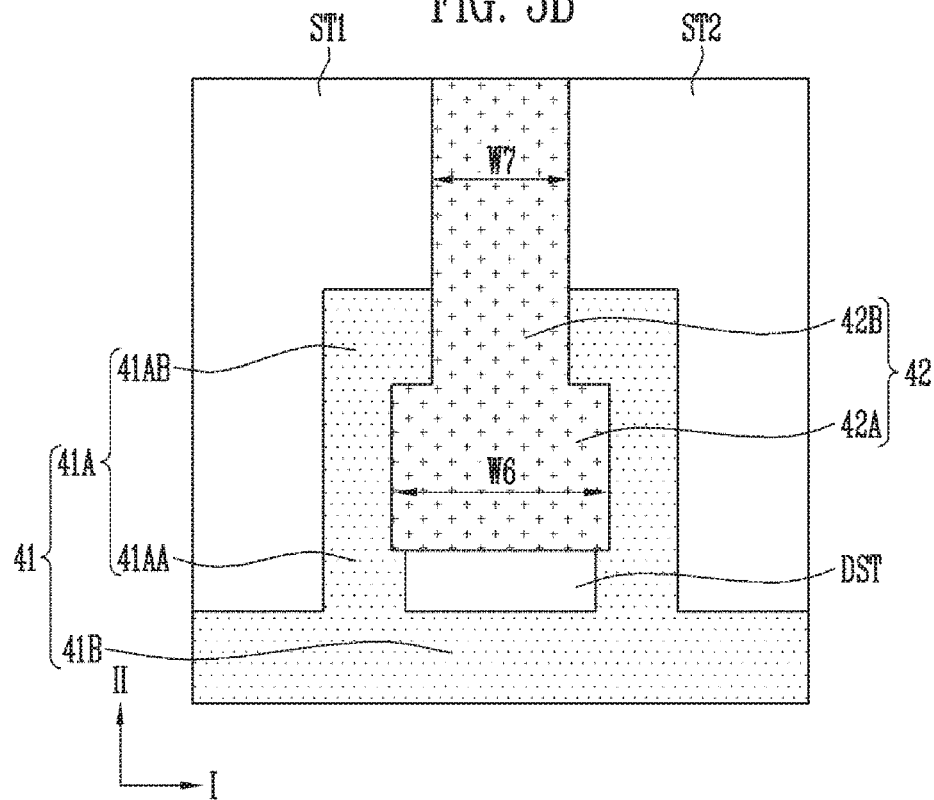

Referring to FIG. 3B, the first insulating layer 41 may include a line pattern 41B extending in the first direction I and protrusion parts 41A extending in the second direction II, intersecting the first direction I, from the line pattern 41B. The second insulating layer 42 may be a line pattern extending in the second direction II, and an end 42A of the second insulating layer 42 may have a width wider than that of a remaining region 42B (W6>W7).

Each of the protrusion parts 41A may have a shape bent to surround the end 42A of the second insulating layer 42. For example, each of the protrusion parts 41A may include a region 41AA extending in the second direction II and an end 41AB bent in the first direction I. Therefore, the end 41AB may be in contact with the remaining region 42B of the second insulating layer 42.

Figure 3C:
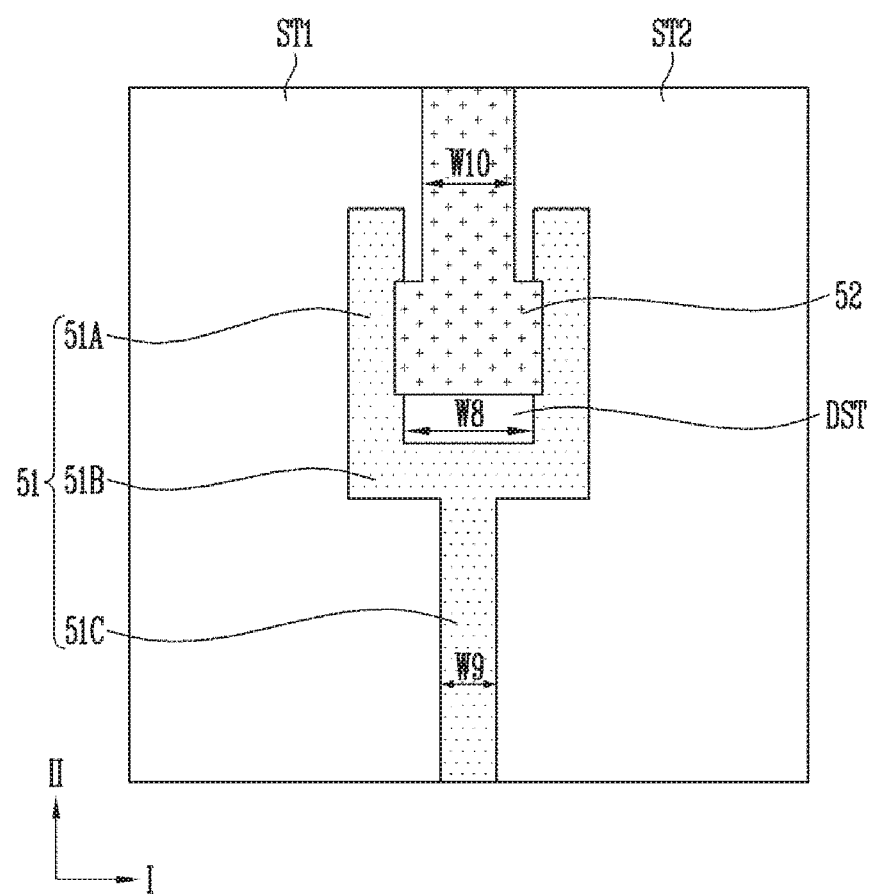

Referring to FIG. 3C, the first insulating layer 51 may include a line pattern 51B extending in the first direction I, first protrusion parts 51A extending in the second direction II from the line pattern 51B, and at least one protrusion part 51C protruding in the opposite direction to the first protrusion parts 51A from the line pattern 51B. A concave part may be defined between the adjacent first protrusion parts 51A. The concave part may be located at a boundary between the adjacent first and second stack structures ST1 and ST2. In addition, the second protrusion part 51C may be located at the boundary between the first stack structure ST1 and the second stack structure ST2. The second protrusion part 51C may have a width narrower than that of the concave part (W9<W8), or have a width substantially equal to that of the concave part (W8=W9).

The second insulating layer 52 may be a line pattern extending in the second direction II. The second insulating layer 52 may be inserted between the first protrusion parts 51A to be in contact with at least one of the first protrusion parts 51A. In addition, an end of the second insulating layer 52 may have a width wider than that of a remaining region, and the remaining region may have a width wider than the second protrusion part 51C (W10>W9). A center of the second insulating layer 52 may correspond to that of the second protrusion part 51C, or be offset in the first direction I.

Figure 3D:
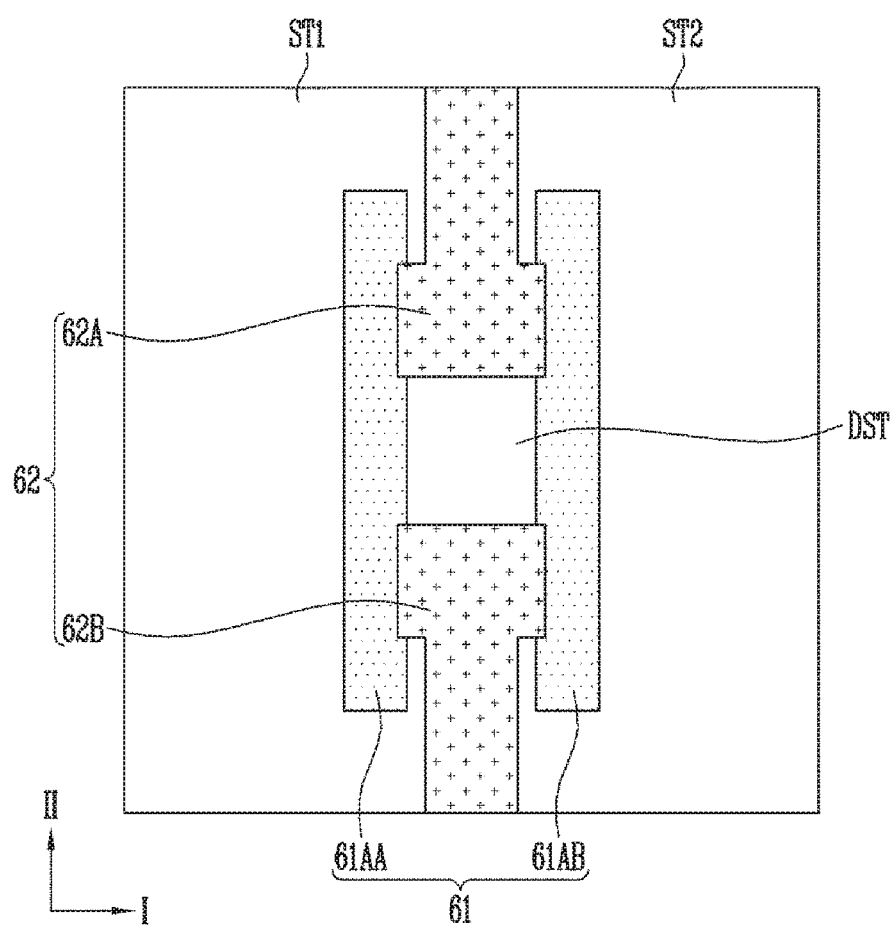

Referring to FIG. 3D, the first insulating layer 61 may include first and second line patterns extending in the second direction II. For example, the first insulating layer 61 may include a first line pattern 61AA penetrating the first stack structure ST1 and a second line pattern 61AB penetrating the second stack structure ST2.

The second insulating layer 62 may be located between the first stack structure ST1 and the second stack structure ST2, and may be inserted between the first line pattern 61AA and the second line pattern 61AB. Therefore, the second insulating layer 62 may be in contact with at least one of the first line pattern 61AA and the second line pattern 61AB. Also, the second insulating layer 62 may have a structure in which its end extends.

The second insulating layer 62 may include a third line pattern 62A and a fourth line pattern 62B. The third line pattern 62A may extend in the second direction II, and may overlap with one end of at least one of the first and second line patterns 61AA and 61AB. The fourth line pattern 62B may extend in the second direction II, and may overlap with the other end of at least one of the first and second line patterns 61AA and 61AB. A dummy stack structure DST may be located between the third line pattern 62A and the fourth line pattern 62B. The dummy stack structure DST may be isolated by the first to fourth line patterns 61AA, 61AB, 62A, and 62B.

Figure 4:
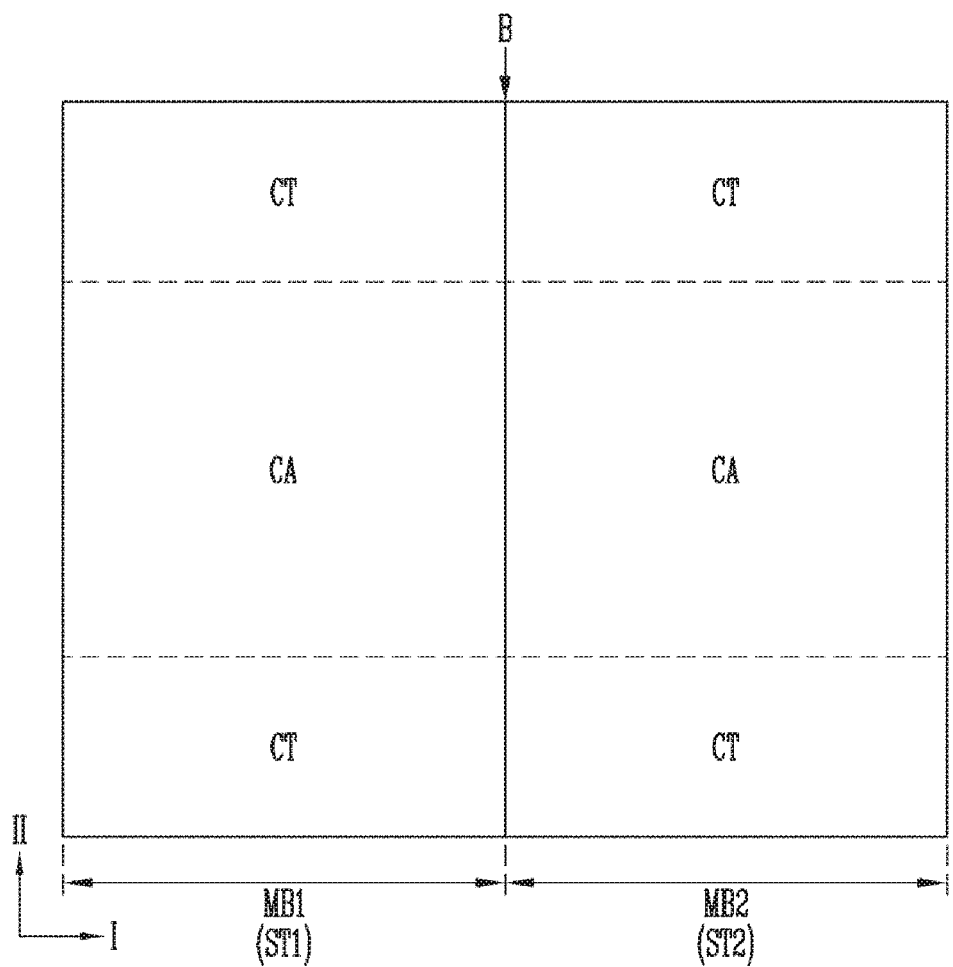
FIG. 4 is a layout illustrating a structure of a semiconductor device according to an embodiment of the present disclosure.

FIG. 4 is a layout illustrating a structure of a semiconductor device according to an embodiment of the present disclosure.

Referring to FIG. 4, the semiconductor device according to an embodiment of the present disclosure may include a plurality of memory blocks MB1 and MB2, and each of the memory blocks MB1 and MB2 may include a cell region CA and a contact region CT. The cell region CA may be a region in which a memory cell array including memory strings is located. The contact region CT may be a region for applying a bias for driving the memory strings, and an interconnection structure including contact plugs, lines, and the like may be located in the contact region CT. The contact region CT may be located at both sides of the cell region CA, or may be located at only one side of the cell region CA.

Each of the memory blocks MB1 and MB2 may include a stack structure, and the stack structure may include conductive layers and insulating layers, which are alternately stacked. The conductive layers may be word lines, select lines, and the like. Meanwhile, in order to perform a program, read, or erase operation, a first stack structure ST1 of a first memory block MB1 and a second stack structure ST2 of a second memory block MB2 may be electrically separated from each other. For example, when data is erased in units of memory blocks, first conductive layers included in the first stack structure ST1 of the first memory block MB1 and second conductive layers included in the second stack structure ST2 of the second memory block MB2 may be insulated from each other. Therefore, in order to insulate the first conductive layers and the second conductive layers from each other, a slit insulating structure may be located at a boundary B between the first memory block MB1 and the second memory block MB2. Also, the slit insulating structure may include the first and second insulating layers 31 to 61 and 32 to 62 described above.

The first and second insulating layers 31 to 61 and 32 to 62 according to an embodiment of the present disclosure are not limited to the slit insulating structure, and may be applied to all structures in which at least two insulating layers are connected.

Figure 5A:
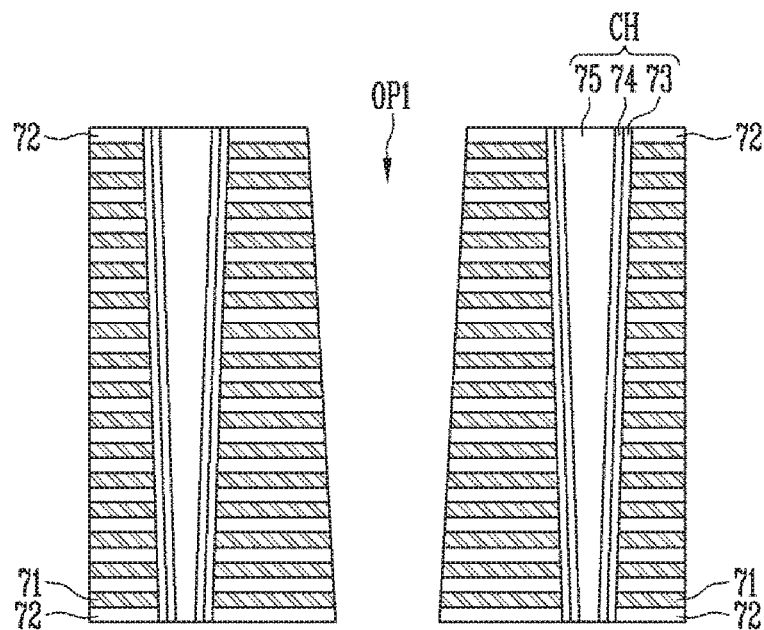
FIGS. 5A to 5C are sectional views illustrating a manufacturing method of a semiconductor device according to an embodiment of the present disclosure.
Figure 5B:
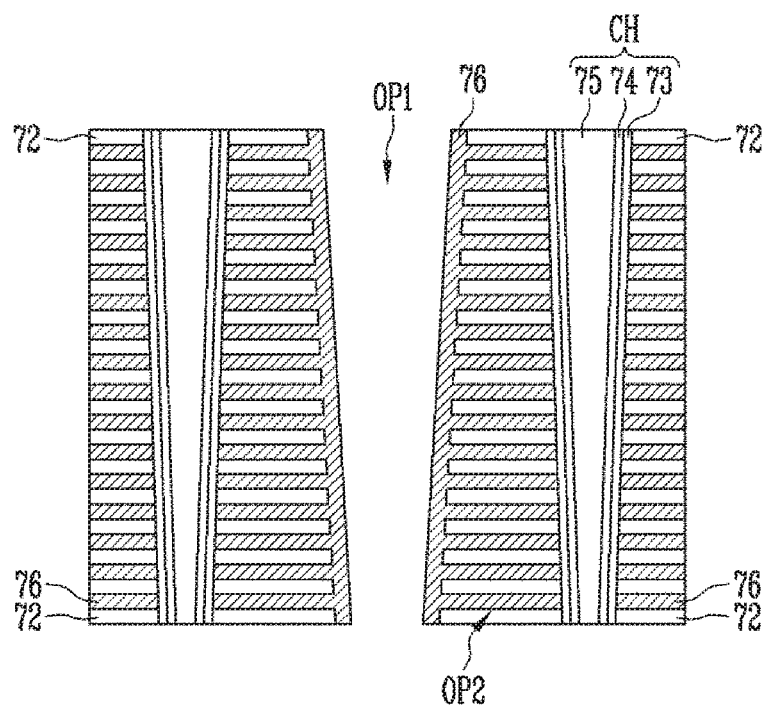
Figure 5C:
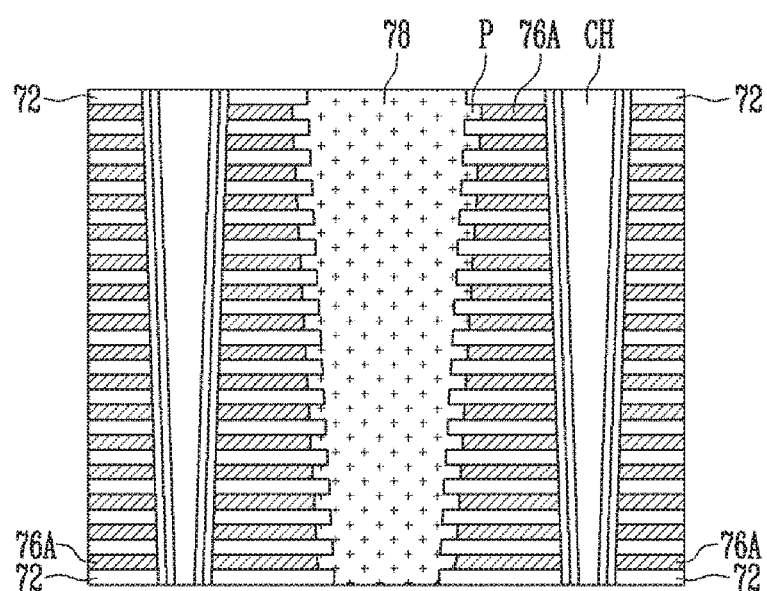

FIGS. 5A to 5C are sectional views illustrating a manufacturing method of a semiconductor device according to an embodiment of the present disclosure. Hereinafter, a method of forming memory cells will be described.

Referring to FIG. 5A, first material layers 71 and second material layers 72 may be alternately formed on a substrate on which a lower structure including a line structure, a peripheral circuit, and the like is formed. The first material layers 71 may be used to form gate electrodes of memory cells, select transistors, and the like, and the second material layers 72 may be used to insulate the stacked gate electrodes from each other.

The first material layers 71 may be formed of a material having a high etching selection ratio with respect to the second material layers 72. In an example, the first material layers 71 may be sacrificial layers including nitride, etc., and the second material layers 72 may be insulating layers including oxide, etc. In another example, the first material layers 71 may be conductive layers including polysilicon, tungsten, metal, etc., and the second material layers 72 may be insulating layers including oxide, etc. In still another example, the first material layers 71 may be conductive layers including doped polysilicon, etc., and the second material layers 72 may be sacrificial layers including undoped polysilicon, etc. Hereinafter, a case where the first material layers 71 are sacrificial layers and the second material layers 72 are insulating layers will be described.

Subsequently, a channel structure CH penetrating the first and second material layers 71 and 72 may be formed. The channel structure CH may include a channel layer 74 penetrating the first and second material layers 71 and 72 and a memory layer 73 surrounding a sidewall of the channel layer 74. Also, the channel structure CH may further include a core layer 75 filling in the channel layer 74. For example, the memory layer 73 may include a tunnel insulating layer, a data storage layer, and a charge blocking layer, and the data storage layer may include a floating gate, a charge trap material, polysilicon, a nitride, nano dots, a variable resistance material, a phase change material, and the like.

Subsequently, a first opening OP1 penetrating the first and second material layers 71 and 72 may be formed. The first opening OP1 may be a slit located at a boundary between adjacent memory blocks. The first opening OP1 may be used as a passage for replacing the first material layers 71 or the second material layers 72 with third material patterns 76A (see FIG. 5C). Therefore, the first opening OP1 may be formed to a depth with which the first material layers 71 or the second material layers 72 are entirely exposed.

Referring to FIG. 5B, second openings OP2 are formed by removing the first material layers 71 exposed through the first opening OP1. The channel structure CH may be exposed through the second openings OP2. Subsequently, a third material layer 76 may be formed to fill in the second openings OP2. The third material layer 76 may be formed along an inner surface of the first opening OP1. For example, the third material layer 76 may be a conductive layer, and include a metal such as tungsten.

Referring to FIG. 5C, the third material patterns 76A respectively located in the second openings OP2 may be formed. For example, the third material patterns 76A may be formed by etching a region of the third material layer 76, which is formed in the first opening OP1. In addition, the third material patterns 76A in the second openings OP2 may be etched to a partial thickness such that regions of the second openings OP2, which are adjacent to the first opening OP1, may be re-opened. Accordingly, the stacked third material patterns 76A can be separated from each other.

Subsequently, a second insulating layer 78 may be formed in the first opening OP1. The second insulating layer 78 may have a second slit insulating structure. Also, the second insulating layer 78 may include protrusion patterns P formed at a sidewall thereof.

FIGS. 6A to 8A and 6B to 8B are sectional views illustrating a manufacturing method of a semiconductor device according to an embodiment of the present disclosure. Each of FIGS. 6A to 8A is a layout, and each of FIG. 6B to 8B is a sectional view taken along line A-A' of each of FIGS. 6A to 8A. Hereinafter, a method of forming a first insulating layer and a second insulating layer will be described.

Figure 6A:
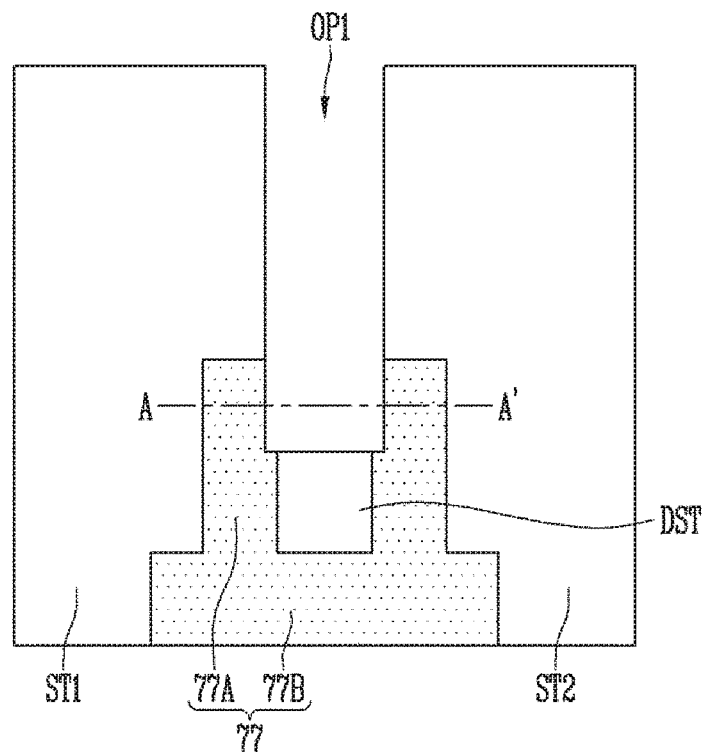
FIGS. 6A, 7A, 8A and 6B, 7B, 8B are sectional views illustrating a manufacturing method of a semiconductor device according to an embodiment of the present disclosure.
Figure 6B:
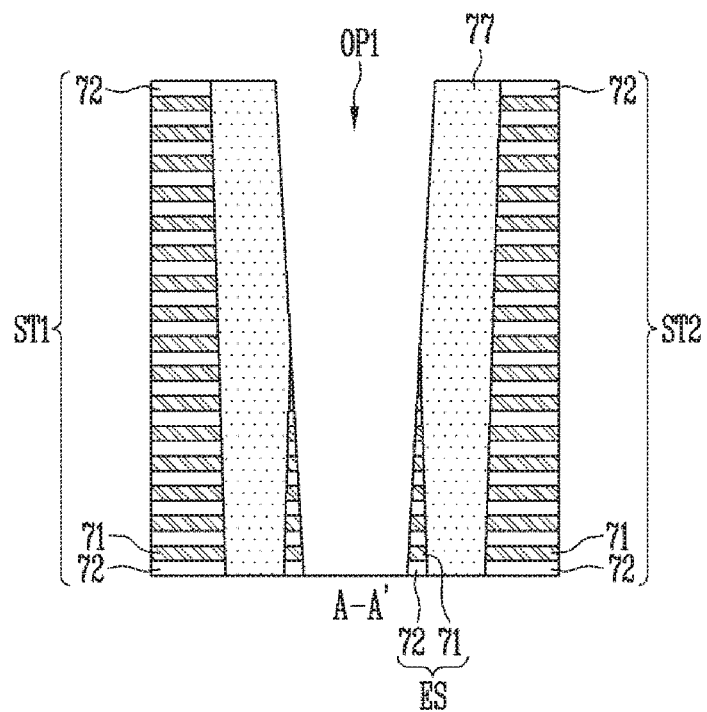

FIGS. 6A and 6B may be a process step corresponding to FIG. 5A described above. Referring to FIGS. 6A and 6B, first material layers 71 and second material layers 72 may be alternately formed on a substrate on which a lower structure including a line structure, a peripheral circuit, and the like is formed.

Subsequently, a first insulating layer 77 penetrating the first and second material layers 71 and 72 may be formed. The first insulating layer 77 may have a first slit insulating structure. For example, the first insulating layer 77 may include a plurality of protrusion parts 77A and at least one concave part defined between the protrusion parts 77A. Also, the first insulating layer 77 may include a line pattern 77B connecting the protrusion parts 77A. The first insulating layer 77 may be formed before the channel structure CH described with reference to FIG. 5A is formed, or may be formed after the channel structure CH is formed. Meanwhile, a shape of the first insulating layer 77 may be modified. For example, the first insulating layer 77 may include the line pattern 51B, the first protrusion parts 51A and the at least one protrusion part 51C as shown in FIG. 3C. Alternatively, the first insulating layer 77 may include the first line pattern 61AA and the second line pattern 61AB as shown in FIG. 3D.

Subsequently, a first opening OP1 penetrating the first and second material layers 71 and 72 may be formed. The first opening OP1 may be inserted into the concave part of the first insulating layer 77 to expose a sidewall of at least one of the protrusion parts 77A. The first opening OP1 may be a slit located at a boundary between adjacent memory blocks. Accordingly, the first and second material layers 71 and 72 may be patterned into a first stack structure ST1, a second stack structure ST2, and a dummy stack structure DST.

The first opening OP1 may be formed by etching the first and second material layers 71 and 72. In a region in which the first opening OP1 and the first insulating layer 77 overlap with each other, the first opening OP1 may be formed by etching the first insulating layer 77 that is a single layer. Since the single layer has an etching rate higher than that of the stacked layers, the overlapping region may be relatively deeply etched. In other words, the first opening OP1 may have an unequal depth, and a punch through which the lower structure is exposed may be generated in the overlapping region.

In order to solve this problem, in an embodiment of the present disclosure, the first opening OP1 may be formed not to completely intersect the first insulating layer 77, i.e., to minimize the area of the overlapping region.

In addition, the first opening OP1 may be formed in a shape of which the sectional area decreases when approaching its bottom, so that the first insulating layer 77 is exposed at only an upper portion of the first opening OP1. In other words, the first and second material layers 71 and 72 may remain between a lower portion of the first opening OP1 and the first insulating layer 77, so that the first insulating layer 77 is not exposed at the lower portion of the first opening OP1. Thus, etching may be stopped at the remaining first and second material layers 71 and 72, and the punch can be prevented. Hereinafter, for convenience of description, the remaining first and second materials 71 and 72 will be designated as an etch stop structure ES.

Figure 7A:
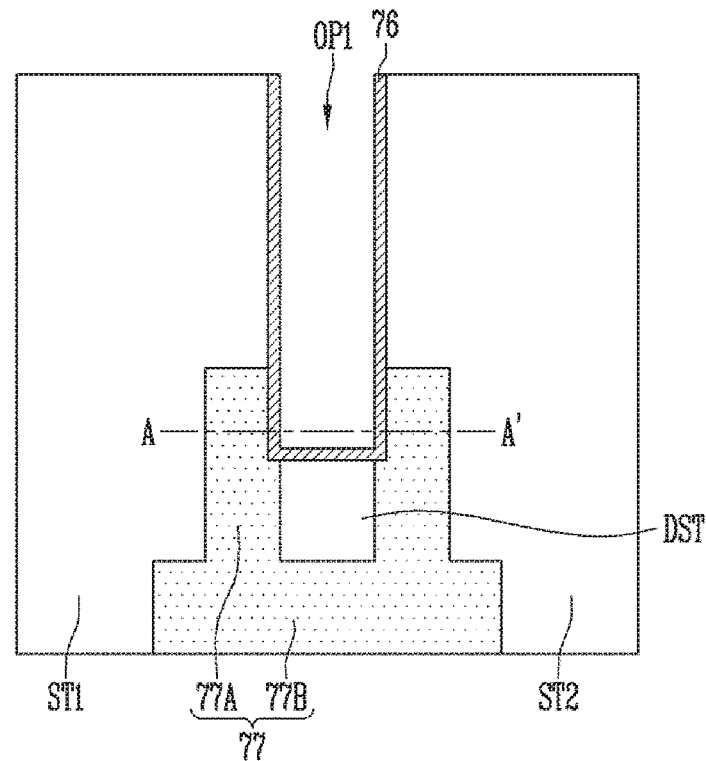
Figure 7B:
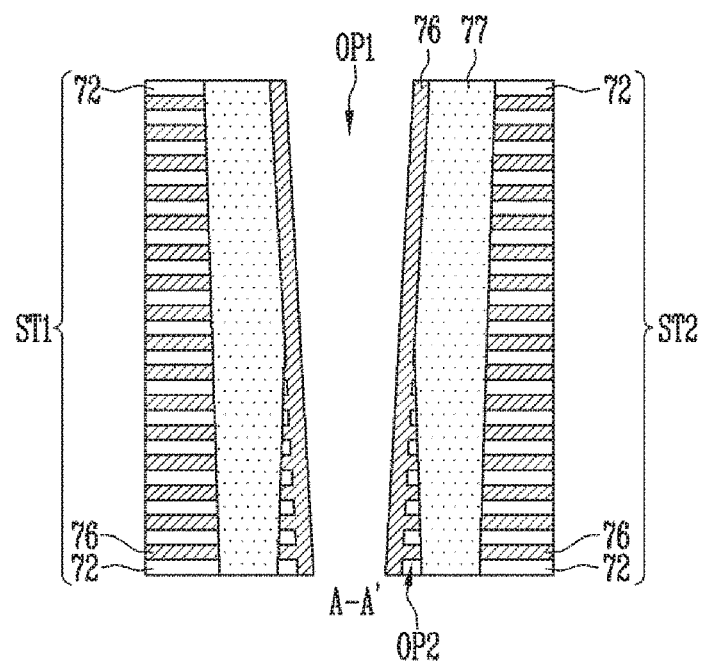

FIGS. 7A and 7B may be a process step corresponding to FIG. 5B described above. Referring to FIGS. 7A and 7B, the first material layers 71 exposed through the first opening OP1 may be selectively removed. The first insulating layer 77 may serve as a support when the first material layers 71 are selectively removed.

Accordingly, the first material layers 71 included in the first stack structure ST1, the second stack structure ST2, and the dummy stack structure DST may be removed, and second openings OP2 may be formed. The etch stop structure ES may have a narrow width as compared with other stack structures, and hence the second openings OP2 may have a relatively narrow width.

Subsequently, a third material layer 76 may be formed to fill in the second openings OP2. The third material layer 76 may be formed along an inner surface of the first opening OP1.

Figure 8A:
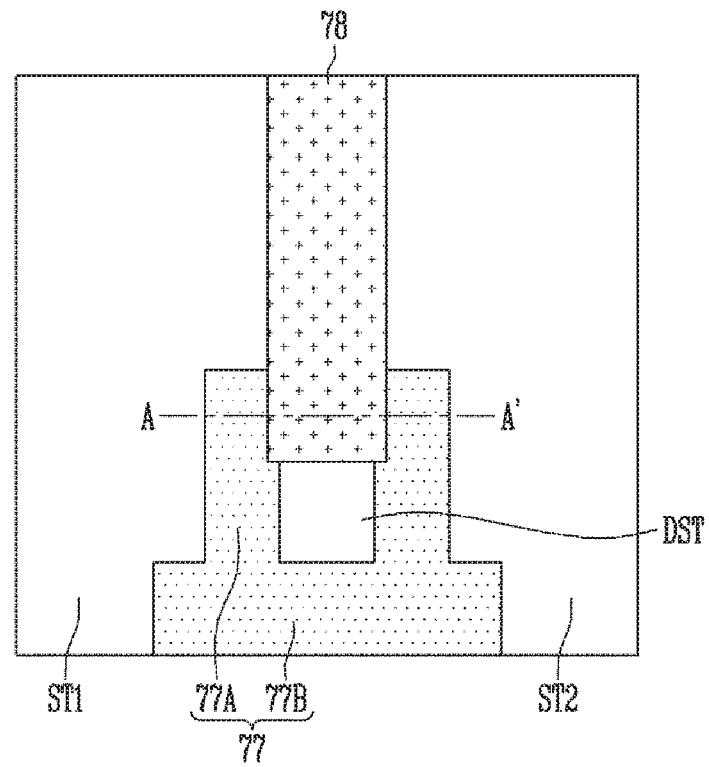
Figure 8B:
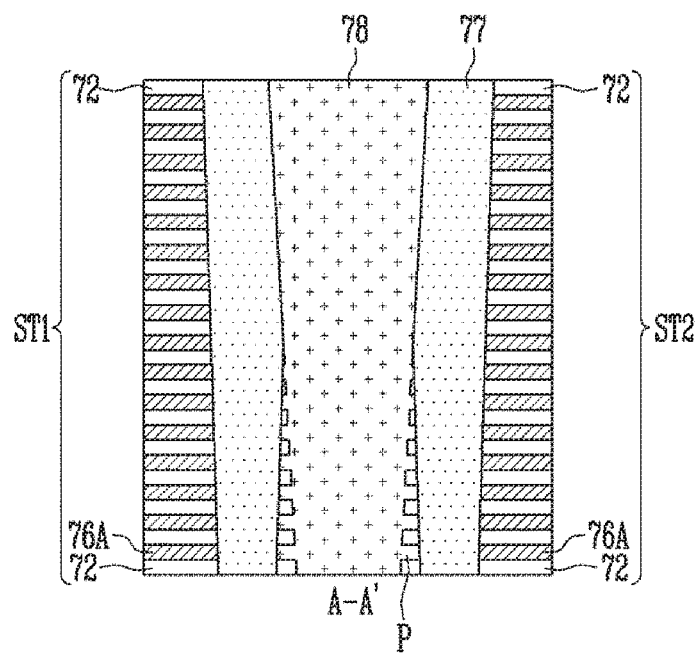

FIGS. 8A and 8B may be a process step corresponding to FIG. 5C described above. Referring to FIGS. 8A and 8B, third material patterns 76A may be respectively formed in the second openings OP2 by etching the third material layer 76. The third material patterns 76A in the second openings OP2 may be etched to a partial thickness such that the stacked third material patterns 76A are separated from each other. The third material patterns 76A in the etch stop structure ES (e.g., the remaining stack structure) having a relatively narrow width may be completely removed. Thus, the second openings OP2 of the etch stop structure ES may be re-opened.

Subsequently, a second insulating layer 78 may be formed in the first opening OP1. An insulating material may also be filled in the second openings OP2 of the etch stop structure ES. Therefore, the second insulating layer 78 may include protrusion patterns P formed at a lower sidewall thereof.

According to the above-described manufacturing method, when the second insulating layer 78 connected to the previously formed first insulating layer 77 is formed, the overlapping area of the first insulating layer 77 and the second insulating layer 78 can be minimized. Thus, the exposure of a void in the first insulating layer 77 or the generation of a punch can be prevented in the process of forming the second insulating layer 78.

Meanwhile, the shapes of the first insulating layer 77 and the second insulating layer 78 may be modified with reference to various embodiments described above. In addition, although a case where the second insulating layer 78 is formed after the first insulating layer 77 is formed is described according to an embodiment, the first insulating layer 77 may be formed after the second insulating layer 78 is formed.

FIGS. 9A to 11A and 9B to 11B are sectional views illustrating a manufacturing method of a semiconductor device according to an embodiment of the present disclosure. Each of FIGS. 9A to 11A is a layout, and each of FIG. 9B to 11B is a sectional view taken along line A-A' of each of FIGS. 9A to 11A. Hereinafter, a method of forming a first insulating layer and a second insulating layer will be described.

Figure 9A:
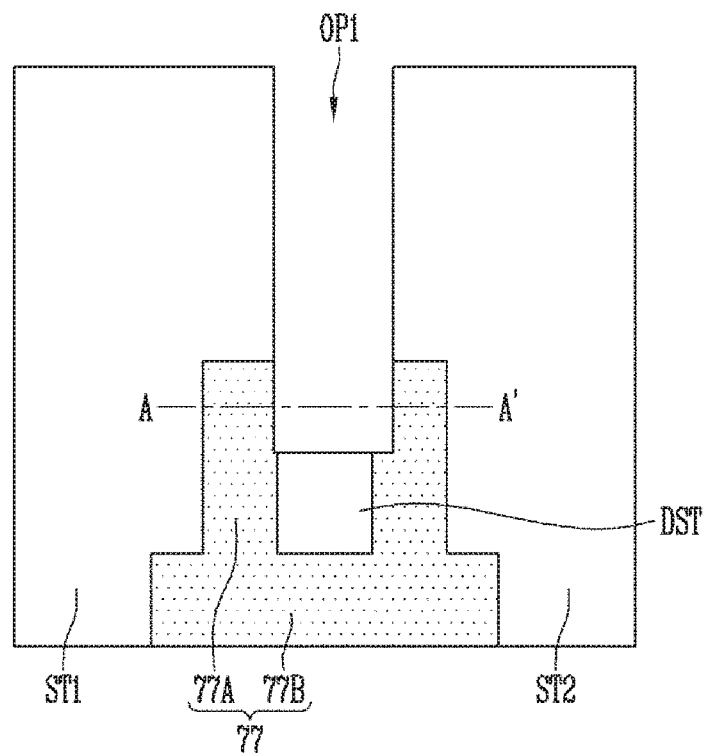
FIGS. 9A, 10A, 11A and 9B, 10B, 11B are sectional views illustrating a manufacturing method of a semiconductor device according to an embodiment of the present disclosure.
Figure 9B:
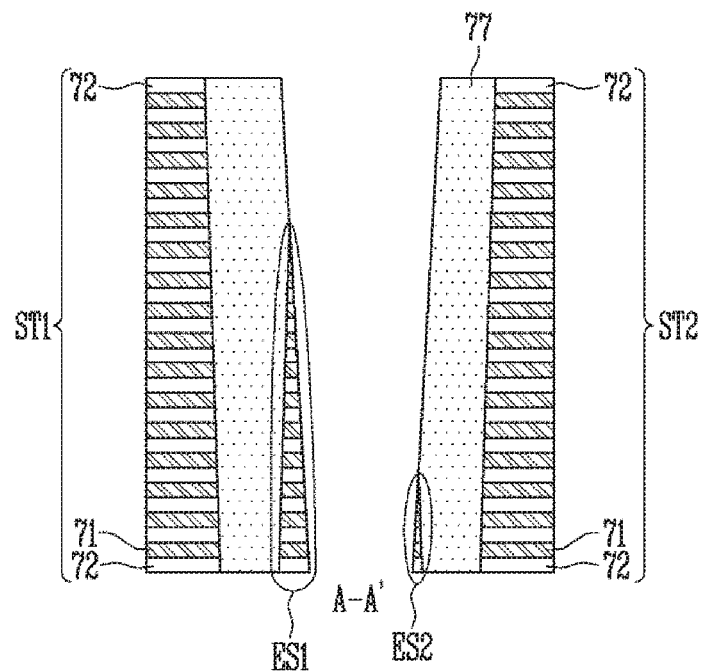

Referring to FIGS. 9A and 9B, first material layers 71 and second material layers 72 may be alternately formed, and a first insulating layer 77 may then be formed. Subsequently, a first opening OP1 penetrating the first and second material layers 71 and 72 may be formed.

The first opening OP1 may be inserted into a concave part of the first insulating layer 77 to expose a sidewall of at least one of protrusion parts 77A. The first opening OP1 may be formed offset to one side. Therefore, etch stop structures ES1 and ES2 may be formed with different heights at both sides of the first opening OP1, or an etch stop structure ES1 may be formed at only one side of the first opening OP1.

Figure 10A:
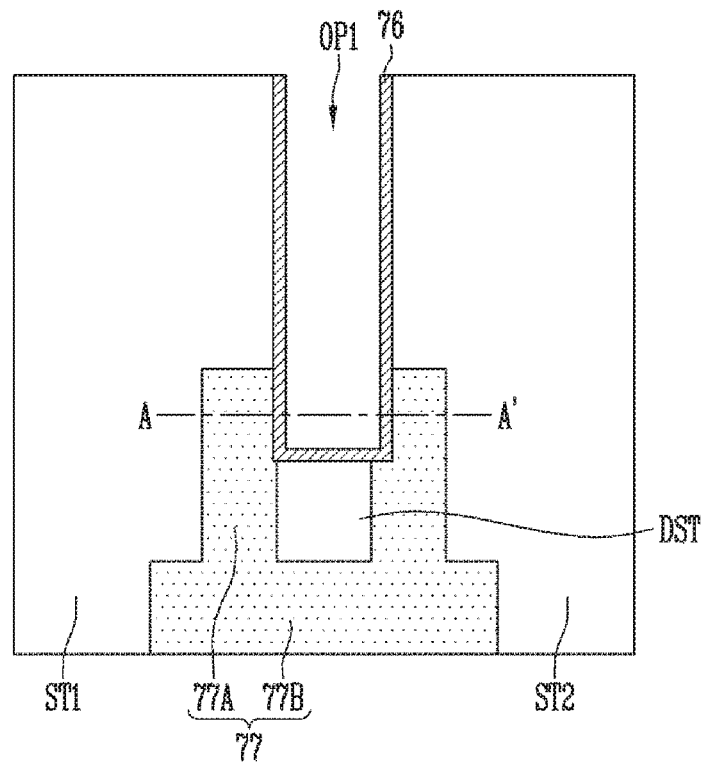
Figure 10B:
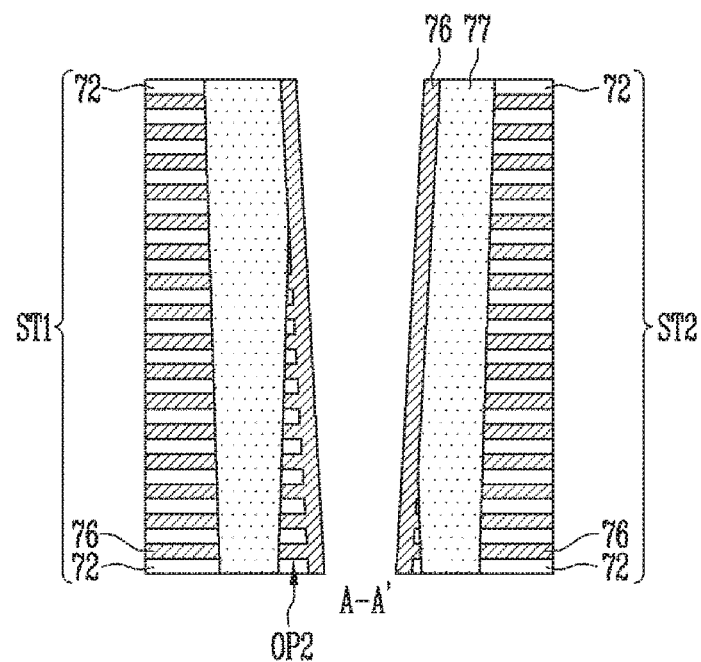

Referring to FIGS. 10A and 10B, second openings OP2 may be formed by selectively removing the first material layers exposed through the first opening OP1. In addition to the first material layers 71 included in a first stack structure ST1 and a second stack structure ST2, the first material layers 71 included in a dummy stack structure DST and the etch stop structures ES1 and ES2 may be removed. Subsequently, a third material layer 76 may be formed to fill in the second openings OP2. The third material layer 76 may be formed along an inner surface of the first opening OP1. The third material layer 76 may fill in the second openings OP2 of the first stack structure ST1, the second stack structure ST2, the dummy stack structure DST, and the etch stop structure ES1 and ES2.

Figure 11A:
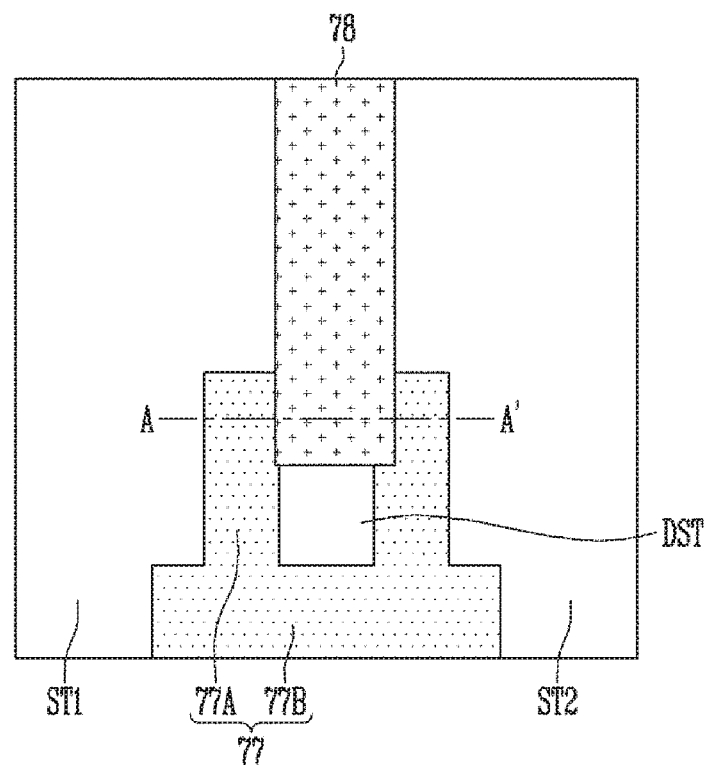
Figure 11B:
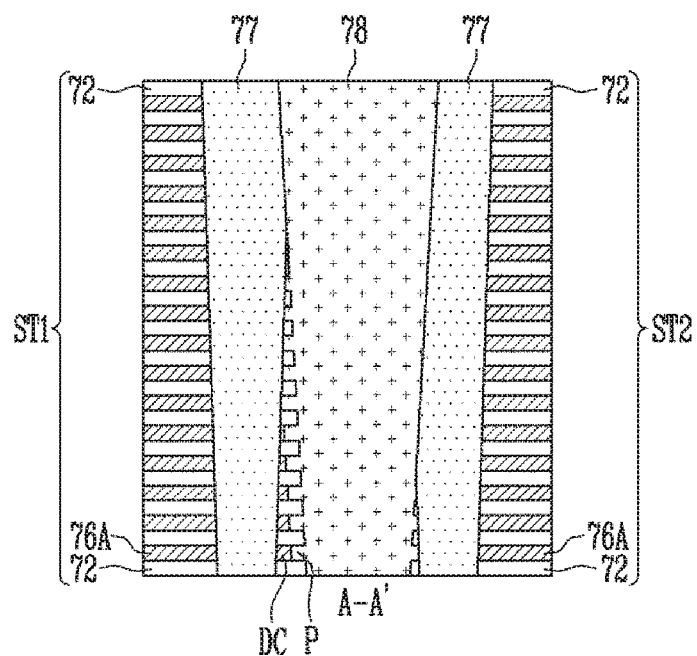

Referring to FIGS. 11A and 11B, third material patterns 76A may be formed in the second openings OP2 by etching the third material layer 76. Subsequently, the third material patterns 76A in the second openings OP2 may be etched to a partial thickness. While the third material patterns 76A included in a second etch stop structure ES2 having a relatively narrow width are completely removed, the third material patterns 76A included in a first etch stop structure ES1 having a relatively wide width might not be completely removed since the third material patterns 76A have a relatively wide width. Therefore, dummy conductive patterns DC may remain in the first etch stop structure ES1.

Subsequently, a second insulating layer 78 may be formed in the first opening OP1. An insulating material may also be filled in the second openings OP2 of the first and second etch stop structures ES1 and ES2, and therefore, protrusion patterns P may be formed at a sidewall of the second insulating layer 78. The protrusion patterns P located at both sidewalls of the second insulating layer 78 may have an asymmetrical structure. For example, numbers of the protrusion patterns P may be different from each other, or widths of the protrusion patterns P may be different from each other.

According to the manufacturing method described above, the dummy conductive pattern DC may remain at one side of the second insulating layer 78, and the third material patterns 76A included in the first stack structure ST1 and the third material patterns 76A included in the dummy stack structure DST may be connected to each other by the dummy conductive pattern DC. However, the dummy conductive pattern DC might not remain between the other side of the second insulating layer 78 and the first insulating layer 77. Thus, the third material patterns 76A included in the dummy stack structure DST and the third material patterns 76A included in the second stack structure ST2 might not be connected to each other. That is, the third material patterns 76A included in the first stack structure ST1 and the third material patterns 76A included in the second stack structure ST2 can be insulated from each other.

Figure 12:
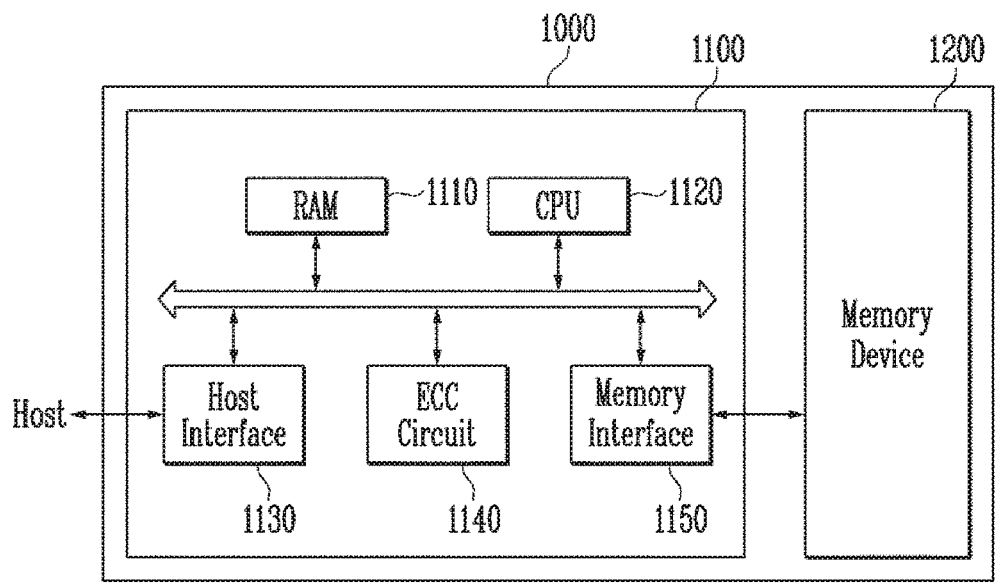
FIGS. 12 and 13 are block diagrams illustrating configurations of memory systems according to embodiments of the present disclosure.

FIG. 12 is a block diagram illustrating a configuration of a memory system according to an embodiment of the present disclosure.

Referring to FIG. 12, the memory system 1000 according to an embodiment of the present disclosure may include a memory device 1200 and a controller 1100.

The memory device 1200 may be used to store data information having various data formats such as texts, graphics, and software codes. The memory device 1200 may be a nonvolatile memory. Also, the memory device 1200 may have the structures described with reference to FIGS. 1A to 11B, and may be manufactured according to the manufacturing methods described with reference to FIGS. 1A to 11B. In an embodiment, the memory device 1200 may include: a first stack structure; a second stack structure adjacent to the first stack structure in a first direction; a first insulating layer including protrusion parts protruding in a second direction intersecting the first direction and a concave part defined between the protrusion parts; and a second insulating layer located between the first stack structure and the second stack structure, the second insulating layer being inserted into the concave part to be in contact with at least one protrusion part among the protrusion parts. The structure and manufacturing method of the memory device 1200 are the same as described above, and therefore, their detailed descriptions will be omitted.

The controller 1100 may be connected to a host and the memory device 1200, and may be configured to access the memory device 1200 in response to a request from the host. For example, the controller 1100 may be configured to control reading, writing, erasing, and background operations of the memory device 1200.

The controller 1100 may include a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 may be configured to control overall operations of the controller 1100. For example, the CPU 1120 may be configured to operate firmware such as a flash translation layer (FTL) stored in the RAM 1110.

The host interface 1130 may be configured to interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may be configured to detect and correct an error included in data that is read from the memory device 1200, using an error correction code (ECC).

The memory interface 1150 may be configured to interface with the memory device 1200. For example, the memory interface 1150 may include an NAND interface or NOR interface.

The controller 1100 may further include a buffer memory (not illustrated) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 according to an embodiment of the present disclosure may include the memory device 1200 having an improved degree of integration and improved characteristics, and thus the degree of integration and characteristics of the memory system 1000 can be improved.

Figure 13:
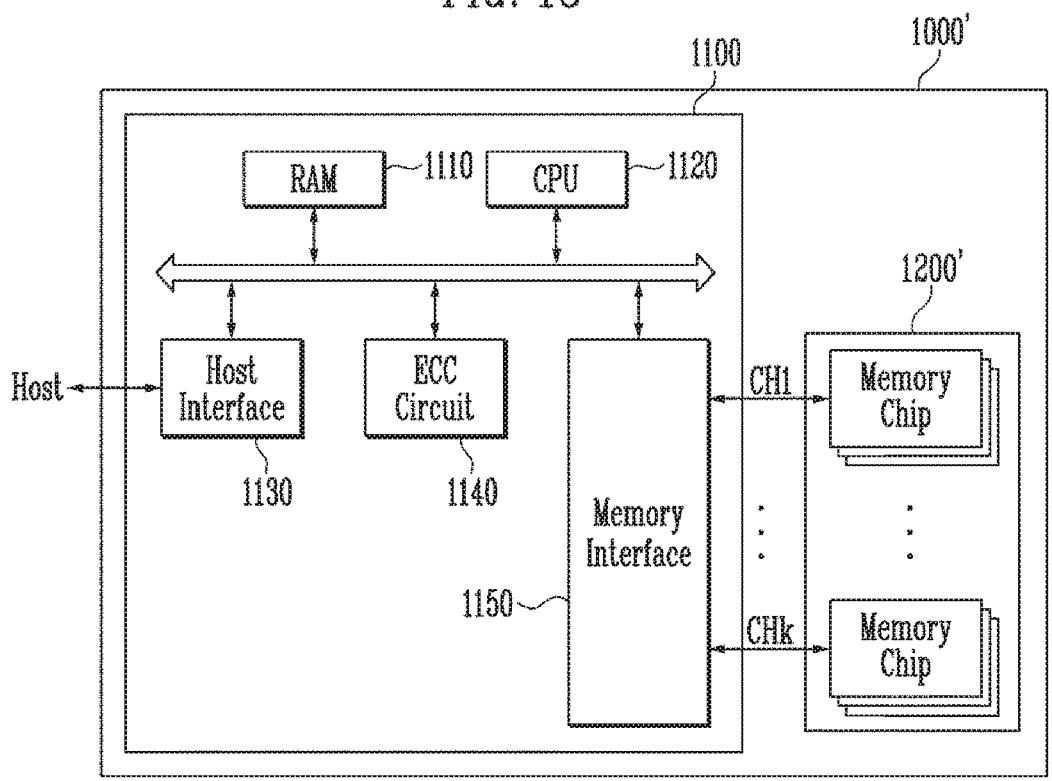

FIG. 13 is a block diagram illustrating a configuration of a memory system according to an embodiment of the present disclosure. Hereinafter, descriptions of contents overlapping with those described above will be omitted.

Referring to FIG. 13, the memory system 1000' according to an embodiment of the present disclosure may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 11B, and may be manufactured according to the manufacturing methods described with reference to FIGS. 1A to 11B. In an embodiment, the memory device 1200' may include: a first stack structure; a second stack structure adjacent to the first stack structure in a first direction; a first insulating layer including protrusion parts protruding in a second direction intersecting the first direction and a concave part defined between the protrusion parts; and a second insulating layer located between the first stack structure and the second stack structure, the second insulating layer being inserted into the concave part to be in contact with at least one protrusion part among the protrusion parts. The structure and manufacturing method of the memory device 1200' are the same as described above, and therefore, their detailed descriptions will be omitted.

The memory device 1200' may be a multi-chip package including a plurality of memory chips. The plurality of memory chips may be divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' according to an embodiment of the present disclosure may include the memory device 1200' having an improved degree of integration and improved characteristics, and thus the degree of integration and characteristics of the memory system 1000' can be improved. Particularly, the memory device 1200' may be configured as a multi-chip package, so that the data storage capacity of the memory system 1000' can be increased, and the operation speed of the memory system 1000' can be improved.

Figure 14:
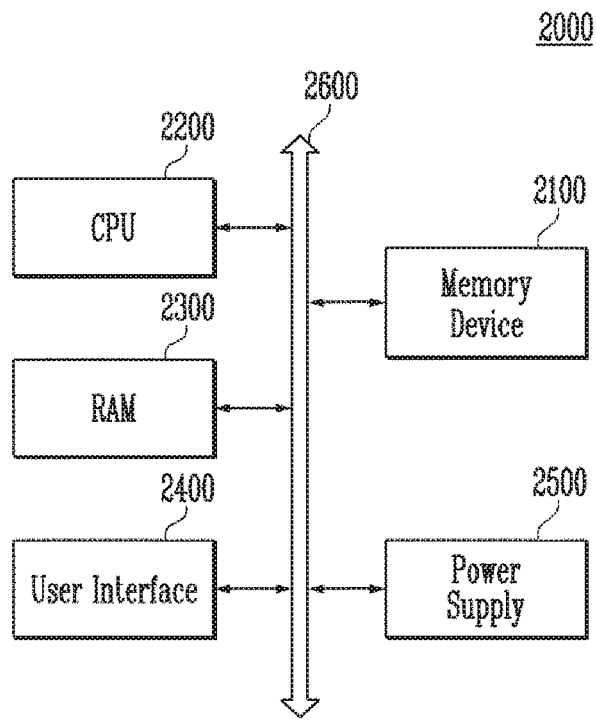
FIGS. 14 and 15 are block diagrams illustrating configurations of computing systems according to embodiments of the present disclosure.

FIG. 14 is a block diagram illustrating a configuration of a computing system according to an embodiment of the present disclosure. Hereinafter, description of contents overlapping with those described above will be omitted.

Referring to FIG. 14, the computing system 2000 according to an embodiment of the present disclosure may include a memory device 2100, a CPU 2200, a RAM 2300, a user interface 2400, a power supply 2500, a system bus 2600, and the like.

The memory device 2100 may store data provided through the user interface 2400, data processed by the CPU 2200, and the like. In addition, the memory device 2100 may be electrically connected to the CPU 2200, the RAM 2300, the user interface 2400, the power supply 2500, and the like through the system bus 2600. For example, the memory device 2100 may be connected to the system bus 2600 through a controller (not illustrated) or directly. When the memory device 2100 is directly connected to the system bus 2600, a function of the controller may be performed by the CPU 2200, the RAM 2300, etc.

The memory device 2100 may be a nonvolatile memory. Also, the memory device 2100 may have the structures described with reference to FIGS. 1A to 11B, and may be manufactured according to the manufacturing methods described with reference to FIGS. 1A to 11B. In an embodiment, the memory device 2100 may include: a first stack structure; a second stack structure adjacent to the first stack structure in a first direction; a first insulating layer including protrusion parts protruding in a second direction intersecting the first direction and a concave part defined between the protrusion parts; and a second insulating layer located between the first stack structure and the second stack structure, the second insulating layer being inserted into the concave part to be in contact with at least one protrusion part among the protrusion parts. The structure and manufacturing method of the memory device 2100 are the same as described above, and therefore, their detailed descriptions will be omitted.

The memory device 2100 may be a multi-chip package including a plurality of memory chips as described with reference to FIG. 13.

The computing system 2000 configured as described above may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to an embodiment of the present disclosure may include the memory device 2100 having an improved degree of integration and improved characteristics, and thus the degree of integration and characteristics of the computing system 2000 can be improved.

Figure 15:
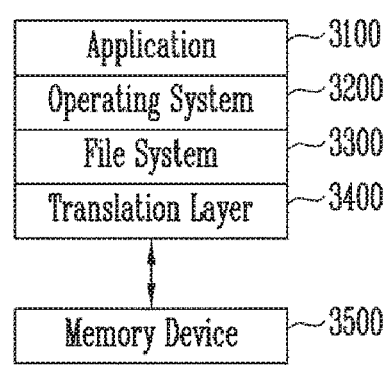

FIG. 15 is a block diagram illustrating a computing system according to an embodiment of the present disclosure.

Referring to FIG. 15, the computing system 3000 according to an embodiment of the present disclosure may include a software layer including an operating system 3200, an application 3100, a file system 3300, a translation layer 3400, and the like. In addition, the computing system 3000 may include a hardware layer of a memory device 3500, etc.

The operating system 3200 may manage software resources, hardware resources, etc. of the computing system 3000, and may control program execution of a central processing unit. The application 3100 may be one of a variety of application programs running on the computing system 3000, and may be a utility executed by the operating system 3200.

The file system 3300 means a logical structure for managing data, files, etc. in the computing system 3000, and may organize the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In FIG. 15, the operating system 3200, the application 3100, and the file system 3300 are illustrated as individual blocks. However, the application 3100 and the file system 3300 may be included in the operating system 3200.

The translation layer 3400 may translate an address into a form suitable for the memory device 3500 in response to a request from the file system 3300. For example, the translation layer 3400 may translate a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may have the structures described with reference to FIGS. 1A to 11B, and may be manufactured according to the manufacturing methods described with reference to FIGS. 1A to 11B. In an embodiment, the memory device 3500 may include: a first stack structure; a second stack structure adjacent to the first stack structure in a first direction; a first insulating layer including protrusion parts protruding in a second direction intersecting the first direction and a concave part defined between the protrusion parts; and a second insulating layer located between the first stack structure and the second stack structure, the second insulating layer being inserted into the concave part to be in contact with at least one protrusion part among the protrusion parts. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 may be included in the operating system layer, and may be driven by a working memory of the computing system 3000. In addition, the translation layer 3400 may be included in the operating system layer or the controller layer.

According to the present disclosure, there can be provided a semiconductor device having a stable structure and improved reliability. Also, in manufacturing of the semiconductor device, the level of difficulty of processes can be lowered, a manufacturing procedure can be simplified, and manufacturing cost can be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, the method comprising:
   forming a stack structure including first material layers and second material layers, which are alternately stacked in a third direction;
   forming a first insulating layer penetrating the stack structure;
   forming a first opening that exposes the first insulating layer and penetrates the stack structure; and
   forming a second insulating layer in the first opening,
   wherein one of the first insulating layer and the second insulating layer includes protrusion parts and a concave part defined between the protrusion parts, and the other of the first insulating layer and the second insulating layer is inserted into the concave part to be in contact with at least one protrusion part among the protrusion parts, and
   wherein the protrusion parts are adjacent to each other in a first direction, protrude in a second direction intersecting the first direction, and penetrate the stack structure in the third direction intersecting the first direction and the second direction.

2. The method of claim 1, wherein, in the forming of the first opening, the first opening is formed having a shape in which the sectional area of the first opening decreases as the sectional area approaches a bottom of the first opening, and a portion of the stack structure remains between a lower portion of the first opening and the first insulating layer.

3. The method of claim 2, further comprising:
   forming second openings by removing the first material layers through the first opening;
   forming a third material layer to fill in the second openings; and
   forming third material patterns respectively located in the second openings by partially etching the third material layer.

4. The method of claim 3, wherein, when the third material layer is partially etched, the third material layer in the remaining stack structure is removed.

5. The method of claim 1, wherein the second insulating layer is inserted into the concave part of the first insulating layer, and includes protrusion patterns formed at a sidewall of the second insulating layer.

6. The method of claim 1, wherein the stack structure is separated, by the first and second insulating layers, into a first stack structure located at a first side of the second insulating layer, a second stack structure located at a second side of the second insulating layer, and a dummy stack structure isolated by the first and second insulating layers.

7. A method of manufacturing a semiconductor device, the method comprising:
- forming a stack structure including first material layers and second material layers, which are alternately stacked in a third direction;
- forming a first slit insulating structure including line patterns, wherein the line patterns are adjacent to each other in a first direction, extend in a second direction intersecting the first direction, and penetrate the stack structure in the third direction intersecting the first direction and the second direction;
- forming a first opening that penetrates the stack structure and is inserted between adjacent line patterns to expose at least one of the adjacent line patterns; and
- forming a second slit insulating structure in the first opening.

8. The method of claim 7, wherein, in the forming of the first opening, the first opening is formed having a shape in which the sectional area of the first opening decreases as the sectional area approaches a bottom of the first opening, and a portion of the stack structure remains between a lower portion of the first opening and the first insulating layer.

9. The method of claim 8, further comprising:
- forming second openings by removing the first material layers through the first opening;
- forming a third material layer to fill in the second openings; and
- forming third material patterns respectively located in the second openings by etching the third material layer.

10. The method of claim 9, wherein, when the third material layer is etched, the third material layer in the remaining stack structure is removed.

11. The method of claim 7, wherein the second slit insulating structure includes protrusion patterns formed at a sidewall of the second slit insulating structure.

12. The method of claim 7, wherein the stack structure is separated, by the first and second slit insulating structures, into a first stack structure located at a first side of the second slit insulating structure, a second stack structure located at a second side of the second slit insulating structure, and a dummy stack structure isolated by the first and second slit insulating structures.

13. A method of manufacturing a semiconductor device, the method comprising:
- forming a stack structure including first material layers and second material layers, which are alternately stacked in a third direction;
- forming a first slit insulating structure including protrusion parts and a concave part defined between the protrusion parts, wherein the protrusion parts are adjacent to each other in a first direction, protrude in a second direction intersecting the first direction, and penetrate the stack structure in the third direction intersecting the first direction and the second direction;
- forming a first opening that penetrates the stack structure in the first direction, exposes at least one of the protrusion parts and is inserted into the concave part; and
- forming a second slit insulating structure in the first opening.

14. The method of claim 13, wherein the second slit insulating structure is in contact with at least one of the protrusion parts.

15. The method of claim 13, further comprising:
- replacing the first material layers with third material layers through the first opening.

16. The method of claim 13, wherein a dummy stack structure is isolated by the first and second slit insulating structures.

17. The method of claim 13, wherein the second slit insulating structure includes protrusion patterns between the second material layers.

18. The method of claim 17, wherein widths of the protrusion patterns are different from each other.

19. The method of claim 13, wherein the second slit insulating structure includes a first region and a second region, and
- a width of the first region is larger than a width of the second region.

20. The method of claim 19, wherein the first region is disposed between the protrusion parts.

* * * * *

UNITED STATES PATENT AND TRADEMARK OFFICE
CERTIFICATE OF CORRECTION

PATENT NO. : 11,024,647 B2
APPLICATION NO. : 16/903113
DATED : June 1, 2021
INVENTOR(S) : Sang Yong Lee et al.

It is certified that error appears in the above-identified patent and that said Letters Patent is hereby corrected as shown below:

In the Claims

Claim 13 Please replace:
"13. A method of manufacturing a semiconductor device, the method comprising:
forming a stack structure including first material layers and second material layers, which are alternately stacked in a third direction;
forming a first slit insulating structure including protrusion parts and a concave part defined between the protrusion parts, wherein the protrusion parts are adjacent to each other in a first direction, protrude in a second direction intersecting the first direction, and penetrate the stack structure in the third direction intersecting the first direction and the second direction;
forming a first opening that penetrates the stack structure in the first direction, exposes at least one of the protrusion parts and is inserted into the concave part; and
forming a second slit insulating structure in the first opening."

With:
--13. A method of manufacturing a semiconductor device, the method comprising:
forming a stack structure including first material layers and second material layers, which are alternately stacked in a third direction;
forming a first slit insulating structure including protrusion parts and a concave part defined between the protrusion parts, wherein the protrusion parts are adjacent to each other in a first direction, protrude in a second direction intersecting the first direction, and penetrate the stack structure in the third direction intersecting the first direction and the second direction;
forming a first opening that penetrates the stack structure in the third direction, exposes at least one of the protrusion parts and is inserted into the concave part; and
forming a second slit insulating structure in the first opening.--

Signed and Sealed this
Second Day of July, 2024

Katherine Kelly Vidal
*Director of the United States Patent and Trademark Office*